(12) United States Patent
Chung et al.

(10) Patent No.: US 11,789,880 B2
(45) Date of Patent: Oct. 17, 2023

(54) LOAD REDUCED NONVOLATILE MEMORY INTERFACE

(71) Applicant: SK Hynix NAND Product Solutions Corp, San Jose, CA (US)

(72) Inventors: Emily P. Chung, Austin, TX (US); Frank T. Hady, Portland, OR (US); George Vergis, Portland, OR (US)

(73) Assignee: SK Hynix NAND Product Solutions Corp., San Jose, CA (US)

( * ) Notice: Subject to any disclaimer, the term of this patent is extended or adjusted under 35 U.S.C. 154(b) by 0 days.

(21) Appl. No.: 17/971,201

(22) Filed: Oct. 21, 2022

(65) Prior Publication Data
US 2023/0116774 A1 Apr. 13, 2023

Related U.S. Application Data

(63) Continuation of application No. 16/664,535, filed on Oct. 25, 2019, now Pat. No. 11,500,795, which is a
(Continued)

(51) Int. Cl.
G06F 13/16 (2006.01)
G06F 13/40 (2006.01)
G06F 13/42 (2006.01)
G11C 11/4076 (2006.01)
G11C 11/4093 (2006.01)
(Continued)

(52) U.S. Cl.
CPC ...... *G06F 13/1673* (2013.01); *G06F 13/4068* (2013.01); *G06F 13/42* (2013.01); *G11C 11/4076* (2013.01); *G11C 11/4093* (2013.01); *G11C 7/1066* (2013.01); *G11C 16/32* (2013.01); *G11C 2207/2254* (2013.01)

(58) Field of Classification Search
CPC .. G06F 13/1673; G06F 13/42; G06F 13/4068; G11C 11/4093; G11C 11/4076
USPC .......................................................... 710/105
See application file for complete search history.

(56) References Cited

U.S. PATENT DOCUMENTS 5,613,078 A 3/1997 Kishigami
8,272,781 B2 9/2012 Nale
(Continued)

FOREIGN PATENT DOCUMENTS

CN 1885277 A 12/2006
CN 101004724 A 7/2007
(Continued)

OTHER PUBLICATIONS

Final Office Action for U.S. Appl. No. 15/201,370, dated Dec. 18, 2018, 20 pages.
(Continued)

*Primary Examiner* — Chun Kuan Lee
(74) *Attorney, Agent, or Firm* — HALEY GUILIANO LLP

(57) ABSTRACT

A storage circuit includes a buffer coupled between the storage controller and the nonvolatile memory devices. The circuit includes one or more groups of nonvolatile memory (NVM) devices, a storage controller to control access to the NVM device, and the buffer. The buffer is coupled between the storage controller and the NVM devices. The buffer is to re-drive signals on a bus between the NVM devices and the storage controller, including synchronizing the signals to a clock signal for the signals. The circuit can include a data buffer, a command buffer, or both.

15 Claims, 11 Drawing Sheets

Related U.S. Application Data continuation of application No. 15/201,370, filed on Jul. 1, 2016, now Pat. No. 10,459,855.

(51) Int. Cl.
*G11C 7/10* (2006.01)
*G11C 16/32* (2006.01)

(56) References Cited

U.S. PATENT DOCUMENTS

| | | | |
|---|---|---|---|
| 8,397,013 B1* | 3/2013 | Rosenband | G11C 5/02 |
| | | | 711/111 |
| 9,484,070 B2 | 11/2016 | Grunzke | |
| 9,653,147 B1* | 5/2017 | Wang | G11C 11/4093 |
| 9,792,224 B2 | 10/2017 | Kumar et al. | |
| 9,990,246 B2 | 6/2018 | Nale et al. | |
| 10,031,677 B1 | 7/2018 | Shallal et al. | |
| 10,163,508 B2 | 12/2018 | Han et al. | |
| 2006/0039204 A1 | 2/2006 | Cornelius | |
| 2007/0028030 A1 | 2/2007 | Mahrla et al. | |
| 2007/0162670 A1 | 7/2007 | Yang et al. | |
| 2007/0250756 A1 | 10/2007 | Gower et al. | |
| 2008/0028127 A1 | 1/2008 | Ware et al. | |
| 2008/0114924 A1 | 5/2008 | Frayer et al. | |
| 2008/0155141 A1 | 6/2008 | LaBerge | |
| 2008/0229135 A1 | 9/2008 | Kanasugi et al. | |
| 2008/0235443 A1 | 9/2008 | Chow et al. | |
| 2009/0070612 A1 | 3/2009 | Adelman et al. | |
| 2009/0276597 A1 | 11/2009 | Reed | |
| 2010/0318691 A1 | 12/2010 | Kitagawa | |
| 2011/0185256 A1 | 7/2011 | Nygren et al. | |
| 2012/0163605 A1 | 6/2012 | Sharon et al. | |
| 2012/0250426 A1 | 10/2012 | Huang | |
| 2012/0297231 A1 | 11/2012 | Qawami et al. | |
| 2013/0007399 A1 | 1/2013 | Smith et al. | |
| 2013/0182524 A1 | 7/2013 | Jeon et al. | |
| 2014/0032812 A1 | 1/2014 | Ong | |
| 2014/0075107 A1 | 3/2014 | Qawami et al. | |
| 2014/0098600 A1 | 4/2014 | Kim et al. | |
| 2014/0181364 A1 | 6/2014 | Berke et al. | |
| 2015/0169238 A1 | 6/2015 | Lee et al. | |
| 2015/0187423 A1 | 7/2015 | Kang | |
| 2015/0213873 A1 | 7/2015 | Joo et al. | |
| 2015/0261446 A1 | 9/2015 | Lee | |
| 2015/0293730 A1 | 10/2015 | Ishibashi | |
| 2015/0294730 A1 | 10/2015 | Lee et al. | |
| 2015/0363107 A1 | 12/2015 | Best et al. | |
| 2016/0019138 A1 | 1/2016 | Lee | |
| 2016/0179388 A1 | 6/2016 | Huang et al. | |
| 2016/0247552 A1* | 8/2016 | Kim | G11C 5/04 |
| 2017/0063311 A1 | 3/2017 | Hwang | |
| 2017/0277643 A1 | 9/2017 | Zhou | |
| 2017/0322749 A1 | 11/2017 | Qawami et al. | |

FOREIGN PATENT DOCUMENTS

| | | |
|---|---|---|
| CN | 101506776 A | 8/2009 |
| CN | 102750226 A | 10/2012 |
| WO | 2016122498 A1 | 8/2016 |

OTHER PUBLICATIONS

International Search Report and Written Opinion for PCT Patent Application No. PCT/US2017/035716, dated Sep. 8, 2017, 28 pages.

Jerome McFarland, Memory Channel Storage (tm) (MCS(tm)) Demystified, diablo technologies, 27 pages.

Terry Grunzke, Micron Technology, Open NAND Flash Interface Specification, Revision 4.0, Apr. 2, 2014, Copyright 2005-2014, Intel Corporation, Micron Technology, Inc., Phison Electronics Corp., SanDisk Corporation, SK Hynix, Inc., Sony Corporation . . . .

Top 11 Reasons to Use Memory Channel Storage for SSDs—Diablo Technologies, Apr. 3, 2014, http://www.diablo-technologies.com-11-reasons-use-memory-channel-storage-ssds-diablo-technologies/,06-14/2016 10:35 PM, 3 pages.

Wu, Jianfeng , et al., "Practice and performance analysis of message memory network interface design on a PCI bus", Wu, Jianfeng et al., "Practice and performance analysis of message memory network interface design on a PCI bus," Journal of Chinese Computer Systems, vol. 22, No. 08.

* cited by examiner

LOAD REDUCED NONVOLATILE MEMORY INTERFACE

PRIORITY

This application is a continuation of, and claims the benefit of priority of, U.S. patent application Ser. No. 16/664,535, filed Oct. 25, 2019, which is a continuation of, U.S. patent application Ser. No. 15/201,370, filed Jul. 1, 2016, now U.S. Pat. No. 10,459,855.

FIELD

The descriptions are generally related to storage devices, and more particular descriptions are related to a load reduced nonvolatile memory interface.

BACKGROUND

There continues to be a tremendous increase in demand for more storage space, and higher throughput for the devices that provide the storage. Solid state technology has many performance and technical advantages over traditional spinning disk storage, and solid state drives (SSDs) find increasing use. The capacity of SSDs is approaching the capacities of devices made with traditional spinning disk technologies, and the prices are coming down to a level considered more affordable.

However, capacity is not the only measure of interest with SSDs. Unfortunately, higher capacity SSDs do not currently offer equivalent performance of lower capacity drives. Research indicates that mid-range capacity SSDs provide the best throughput. The SSD storage controller requires that a memory channel to the nonvolatile memory (NVM) devices drive a minimum number of memory devices or dies to keep the command and data buses at maximum activity, and to have the memory dies accessed in parallel. Increasing the number of memory dies on memory channel eventually reduces overall throughput performance when the increased capacitive loading requires a reduction in the clock frequency on the bus between controller and the NVM devices. For a single memory channel, a system designer traditionally has to choose between high bandwidth and low capacity, or low bandwidth and high capacity.

Since the tradeoff is typically thought of with respect to a single channel, a common solution is to add memory channels, and configure them all for higher bandwidth and lower capacity. However, adding more channels increases the die size and package size of the controller as well as the SSD itself. Increased controller size and packaging increases the cost.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a storage circuit includes a buffer coupled between the storage controller and the nonvolatile memory (NVM) devices. The circuit includes one or more groups of NVM devices, and a storage controller to control access to the NVM devices. The buffer reduces the electrical load of the NVM devices on a bus to the storage controller. The buffer is to re-drive signals on the bus, including synchronizing the signals to a clock signal for the signals. The circuit can include a data buffer, a command buffer, or both. The reduced loading enables increasing the density of NVM devices or memory dies. As described herein, a storage circuit can be high bandwidth as well as high capacity, without adding channels.

The reduced loading enables higher throughput performance even with higher capacity systems. Thus, a storage system can include a controller with a memory channel having more NVM devices coupled in parallel, where clock frequency can remain the same or similar to lower capacity systems due to a lower capacitive loading on the memory channel. By increasing the capacity of a channel, the system can include a higher capacity with fewer channels, which can maintain package size and system form factors. Alternatively, smaller form factors can be achieved for comparable capacity.

Figure 1:
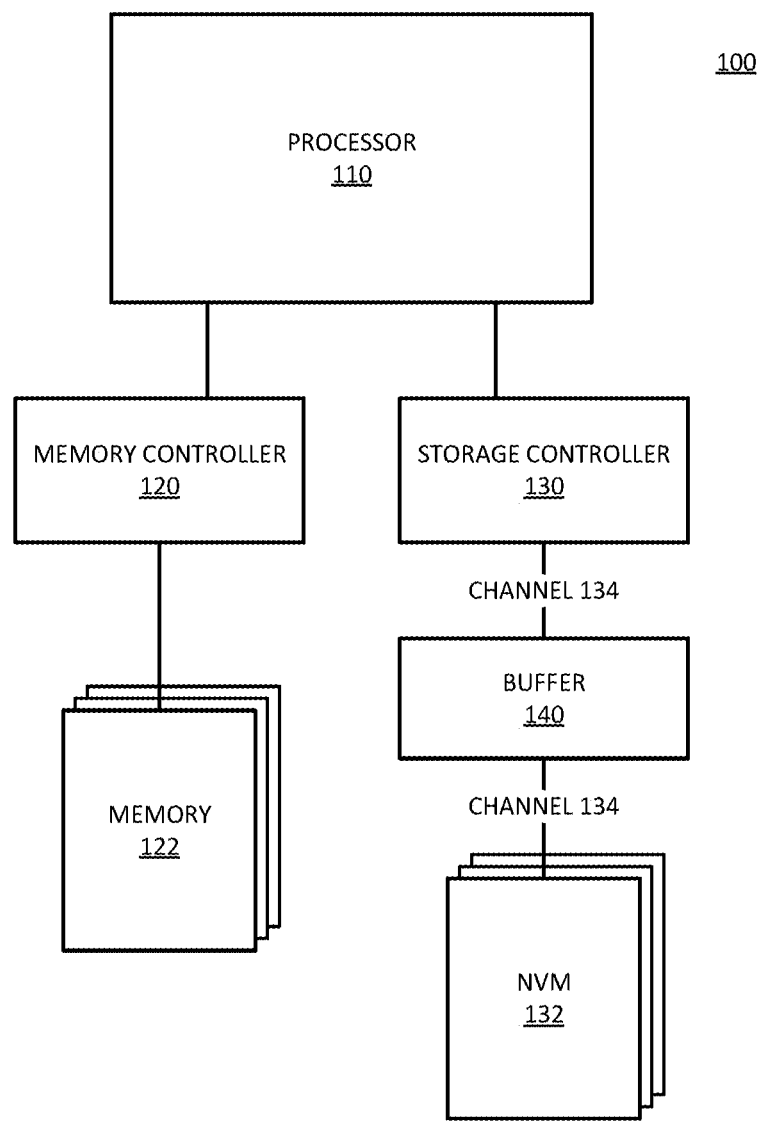
FIG. 1 is a block diagram of an embodiment of a computer system in which nonvolatile storage includes a buffer.

FIG. 1 is a block diagram of an embodiment of a computer system in which nonvolatile storage includes a buffer. System 100 provides one example of a system that includes nonvolatile memory, such as a laptop computer, server, embedded device, handheld device, or other computer system. Processor 110 represents a processing unit of a host computing platform that executes an operating system (OS) and applications, which can collectively be referred to as a "host". The OS and applications execute operations that result in accesses to memory or storage or both. Processor 110 can include one or more separate processors. Each separate processor can include a single processing unit, a multicore processing unit, or a combination. The processing unit can be a primary processor such as a CPU (central processing unit), a peripheral processor, a GPU (graphics processing unit), or other processor, or a combination.

System 100 illustrates memory 122, which represents volatile memory in system 100. Volatile memory is memory whose state (and therefore the data stored on it) is indeterminate if power is interrupted to the device. NVM 112 is nonvolatile memory, which refers to memory whose state is determinate even if power is interrupted to the device. Dynamic volatile memory requires refreshing the data stored in the device to maintain state. Dynamic volatile memory is common as system main memory to store code and data for execution by processor 110. NVM 132 does not need to be refreshed.

Processor 110 accesses memory (or memory devices) 122 via memory controller 120, which represents one or more memory controller circuits or devices, including control logic that generates memory access commands in response to the execution of operations by processor 110. In one embodiment, memory controller 120 is integrated with processor 110 (e.g., an integrated memory controller (iMC)). In one embodiment, memory 122 includes devices mounted directly on a motherboard or host system platform (e.g., a PCB (printed circuit board) on which processor 110 is mounted) of a computing device. In one embodiment, memory 122 can be organized into memory modules, such as dual inline memory modules (DIMMs).

Memory 122 can be or include dynamic volatile memory such as DRAM (dynamic random access memory), or some variant such as synchronous DRAM (SDRAM). Memory devices 122 can include various memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (low power double data rate (LPDDR) version 4, JESD209-4, originally published by JEDEC in August 2014), WIO2 (Wide I/O 2 (WideIO2), JESD229-2, originally published by JEDEC in August 2014), HBM (high bandwidth memory, JESD235, originally published by JEDEC in October 2013), DDR5 (DDR version 5, currently in discussion by JEDEC), LPDDR5 (currently in discussion byJEDEC), HBM2 (HBM version 2), currently in discussion by JEDEC), or others or combinations of memory technologies, and technologies based on derivatives or extensions of such specifications.

Processor 110 accesses NVM (or NVM devices) 132 via storage controller 130, which represents one or more storage controller circuits or devices. Storage controller 130 includes control logic that generates storage transactions to NVM 132 in response to the execution of command by processor 110. A transaction refers to a memory access operation, such as a read or write, which can include a command sequence and an exchange of data, and can occur over multiple transfer cycles (clocks or unit intervals (UIs)). Such transaction can be to access data to place in memory 122, or in a cache of processor 110, or both. Storage controller 130 includes scheduling logic and command logic to generate commands. Storage controller 130 can include or can access buffers or temporary storage to hold data for read or write.

NVM 132 can be or include nonvolatile memory devices such as a block addressable memory device, such as NAND or NOR technologies. NVM 132 can include device technologies such as a three dimensional crosspoint (3DXP) memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other nonvolatile memory technologies.

System 100 can be said to access volatile memory or nonvolatile memory (which may be referred to as "memory" and "storage" for distinction in the description) or both, over one or more memory channels. For example, processor 110 can access memory 122 via one or more memory channels, via one or more memory controllers 120. In one embodiment, processor 110 accesses NVM 132 via one or more memory channels 134. In one embodiment, system 100 can include multiple storage controllers 130. In one embodiment, storage controller 130 includes multiple memory channels to NVM 132. Each separate channel couples to buses and signal lines that couple to multiple devices in parallel, whether channels from memory controller 120 or channels from storage controller 130. Each channel is independently operable. Thus, each channel is independently accessed and controlled, and the timing, data transfer, command and address exchanges, and other operations are separate for each channel. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, storage controller 130 represents an ASIC (application specific integrated circuit) or other controller on a solid state drive (SSD). As such, storage controller 130 can interface with processor 110 via one or more other control circuits in processor 110 or in a chipset that interconnects storage resources to processor 110. Storage controller 130 may be referred to as an SSD controller. In one embodiment, NVM 132 includes devices that can respond to volatile memory device command protocols (e.g., DDR4 protocols). In one embodiment, controller 130 supports both a memory command protocol and a command protocol for buffer 140, which can enable channel 134 to couple multiple NVM devices 132 to buffer 140 in a tree network instead of a point to point network.

Buffer 140 represents a buffering device on channel 134, which can reduce the load on the memory channel. For example, as a point to point network, channel 134 suffers significant loading as more NVM devices 132 are coupled to the channel. As a buffered channel, the I/O (input/output) hardware of storage controller 130 sees only the loading of buffer 140, and buffer 140 re-drives the signals on channel 134 to NVM devices 132. Thus, buffer 140 can act as a load reducer and repeater between storage controller 130 and NVM 132.

As briefly mentioned, channel 134 can be considered to support two command protocols. The first command protocol is a memory command protocol to send commands to NVM 132. The second command protocol is a command protocol for buffer 140, which enables control over the operations of the buffer. In one embodiment, storage controller 130 first sends a memory command (e.g., over a command/address bus, which may be referred to as a C/A bus or ADD/CMD bus or other designation). In such an embodiment, storage controller 130 sends a command over a buffer command bus to buffer 140, and sends such a command after sending the command to NVM 132. In one embodiment, channel 134 can stage the command protocols via scheduling timing to ensure meeting memory channel protocol timings.

For example, consider a case where channel 134 operates in accordance with a DDR4 protocol to interface with 3DXP memory devices as NVM 132. By controlling the scheduling of command signals to the 3DXP memory devices and buffer 140, storage controller 130 can ensure channel 134 complies with both DDR4 protocol timings for the exchange of data with storage controller 130, as well as 3DXP protocol timings to the extent there is a difference. Such protocol timing compliance does not necessarily require changing the 3DXP devices, and can enable the use of a DDR4-compliant data buffer as buffer 140 (e.g., reusing a data buffer of an LRDIMM (load reduced dual inline memory module)). Alternatively to timing control over the command signals, buffer 140 can be designed with logic that might accommodate both protocol timings. Such logic could impact write and read latency in DIMM implementations of system 100, where NVM devices 132 are mounted in one or more DIMMs.

In one embodiment, channel 134 supports training both a host interface of buffer 140 (with respect to channel 134 coupled to storage controller 130) and a memory interface (with respect to NVM 132). In one embodiment, the support for two command protocols discussed above may be necessary to implement the training of the two interfaces. In one embodiment, channel 134 can write fixed patterns into a register of buffer 140 (e.g., a multipurpose register (MPR)) to enable buffer 140 to compare read data with the fixed patterns for the NVM for read delay training. Thus, storage controller 130 and buffer 140 can train the host interface, and the storage controller can write data into buffer 140, which the buffer can use to train the timing of the memory interface. It will be understood that the memory interface, or the hardware connecting buffer 140 and NVM 132 can implement the host interface, with the timing adjusted by buffer commands to comply also with a protocol of NVM 132, in an implementation where the protocols are different.

In one embodiment, system 100 supports the use of a cascaded tree structure or other type of tree to couple multiple buffers 140 and multiple groups of NVM devices 132. As one example, consider the description made below with reference to FIG. 6. In one embodiment, with respect to the timing of different protocols, storage controller 130 can control the timing of command signals to enable longer bursts of data transfer, even with memory devices or protocols that would apply different data bursts. More detail is provided below with respect to FIG. 3.

Figure 2:
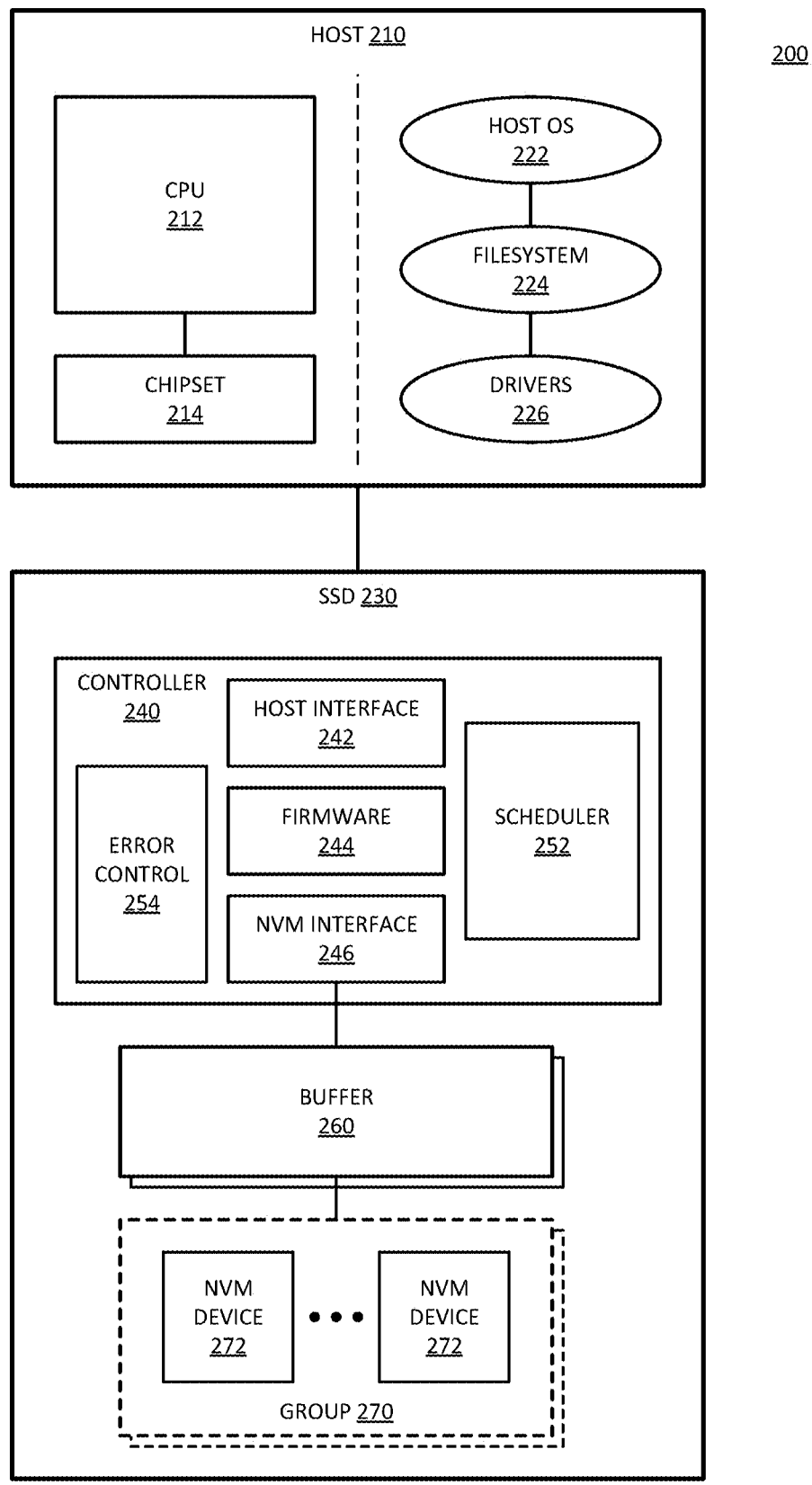
FIG. 2 is a block diagram of an embodiment of a system with a solid state drive that includes a buffer between a controller and the nonvolatile memory devices.

FIG. 2 is a block diagram of an embodiment of a system with a solid state drive (SSD) that includes a buffer between a controller and the nonvolatile memory devices. System 200 includes host 210 coupled to SSD 230. System 200 provides one example of a system in accordance with system 100 of FIG. 1. Host 210 represents a host hardware platform that connects to SSD 230. Host 210 includes CPU (central processing unit) 212 or other processor. CPU 212 represents any host processor that generates requests to access data stored on SSD 230, either to read the data or to write data to the storage, or both. Host 210 includes chipset 214, which represents other hardware components that can be included in connecting between CPU 212 and SSD 230. For example, chipset 214 can include drivers and other logic or circuitry to provide access to SSD 230. In one embodiment, chipset 214 includes a storage controller, which is a host-side controller that is separate from controller 240 within SSD 230.

On one side of the dashed line, host 210 illustrates selected components of the hardware platform of host 210. On the other side of the dashed line, host 210 illustrates one embodiment of logical layers of host 210. In one embodiment, host 210 includes host OS 222, which represents the host operating system or software platform for the host. CPU 212 can execute host OS 222 and provide a software platform on which applications, services, agents, or other software executes. Filesystem 224 represents control logic for controlling access to SSD 230. Filesystem 224 can manage what addresses or memory locations are used to store what data. There are numerous filesystems known, and filesystem 224 can implement known filesystems or other proprietary systems. In one embodiment, filesystem 224 is part of host OS 222. Drivers 226 represent system-level modules that control hardware. In one embodiment, drivers 226 include a software application to control the hardware of SSD 230.

SSD 230 represents a solid state drive that includes NVM devices 272 to store data, and buffer 260 to couple NVM devices 272 to controller 240. Controller 240 controls access to NVM devices 272. In one embodiment, controller 240 represents a storage controller in accordance with any embodiment described herein. In one embodiment, storage controller 240 is an application specific integrated circuit (ASIC). Controller 240 includes host interface 242 to couple to CPU 212, either directly or through other hardware components. Controller 240 includes NVM interface 246 to interface to NVM devices 272. Host interface 242 and NVM interface 246 can represent hardware components to interface with signal lines to interconnect devices, as well as software or firmware components to control the interfaces. In one embodiment, the interfaces can be controlled via state machines or other logic. Such logic can be implemented in hardware, software, or a combination.

Firmware 244 controls the hardware interfaces to enable communication. In one embodiment, firmware 244 includes at least a portion of the logic that could be considered host interface 242 or NVM interface 246, or both. In one embodiment, firmware 244 provides a series of command sequences to NVM devices 272, and can control the timing of the command sequences. SSD 230 includes buffer 260, which represents a buffer in accordance with any embodiment described herein that reduces the loading of NVM devices 272 on the memory channel in SSD 230. In one embodiment, firmware 244 controls the timings of commands to buffer 260 to control the transfer of data to NVM devices 272 for a write transaction or from NVM devices 272 for a read transaction.

Controller 240 includes scheduler 252 to schedule operations such as the generation and sending of commands or the transfer of data for data access transactions. In one embodiment, scheduler 252 includes one or more queues to buffer sequences of operations. In one embodiment, controller 240 includes error control logic 254 to handle data errors in accessed data, and corner cases in terms of compliance with signaling and communication interfacing.

SSD 230 includes one or more buffers 260. In one embodiment, buffer 260 represents a data buffer, which buffers and re-drives the data signals for a read or write transaction. In one embodiment, buffer 260 includes a command buffer, which buffers and re-drives command signals. It will be understood that common implementations of system 200 will benefit more from data buffering than command buffering, since there are typically multiple data transfer cycles of data for every command. Even so, it will be understood that command buffering can be performed in addition to data buffering.

In one embodiment, one or more buffers 260 are repurposed data buffer components, such as data buffers used in volatile memory DIMM solutions. In one embodiment, one or more buffers 260 reuse a DDR4 LRDIMM Data Buffer DDR4DB02 (DB) component. In one embodiment, buffer 260 acts as a repeater for signals. Buffer 260 can be considered a load reduction agent or proxy for host 210. Buffer 260 can provide load reduction for NVM devices 272. In one embodiment, controller 240 interfaces with NVM devices 272 at speeds or with a modified interface of a traditional volatile memory interface. Even in the case of a reuse of a known data buffer, system 200 is configured differently from a traditional volatile memory system that includes load buffering. For example, the interface to NVM devices 272 will be different, at least in that one or more timings will be controlled differently from a typical volatile memory interface. In one embodiment, in addition to re-driving signals (e.g., data or command signals or both) from NVM devices 272 or to NVM devices 272 or both, buffer 260 can re-time the signals. The re-timing can include synchronizing the signals to a strobe or clock signal.

In one embodiment, NVM devices 272 are organized as one or more groups 270 of devices. A group 270 of NVM devices 272 includes multiple devices. NVM devices 272 can be or include packaged devices. NVM devices 272 can be or include circuit dies, which can be mounted directly on a circuit substrate, or packaged with multiple dies per I/C (integrated circuit) package. In one embodiment, SSD 230 includes one buffer 260 per group 270 of N NVM devices 272, such as eight or sixteen devices. In one embodiment, SSD 230 includes multiple circuit boards of NVM resources, with a data buffer 260 and a group 270 of NVM devices per circuit board. In one embodiment, such circuit boards can be coupled in a tree network, layering buffers in a hierarchy.

In one embodiment, NVM devices 272 and buffer 260 support data transfer in bursts. A burst of data includes a specified burst length (BL) number of unit intervals of data transfer, where a transfer includes one bit from each signal line of a memory interface per transfer cycle or per unit interval. A data access transaction includes a data access request, in response to which controller 240 issues a data access command, which is associated with a sequential burst of bits on each signal line of the data interface for multiple transfer cycles. Thus, an implementation of buffer 260 as a data buffer will receive a stream of bits for a memory access transaction.

In an embodiment where a burst length is used, there may be a mismatch between the BL configuration of a data buffer 260 and a BL configuration of NVM devices 272. For example, consider that data buffer 260 is configured to buffer 8 cycles of data bits, or is configured for BL8, and that NVM devices 272 are configured for data access transactions of BL16. In one embodiment, controller 240 issues back to back requests or commands, and data buffer 260 receives the same command twice. In one embodiment, in response to receiving the consecutive commands that are the same, data buffer 260 treats the commands as a single command with double the burst length. For example, consecutive commands for data transfers where data buffer 260 would treat the commands as BL8 commands, the data buffer can treat the two requests as being for a single BL16 command. Other burst lengths are possible.

In one embodiment, groups 270 include multiple DIMMs with multiple NVM devices each. In one embodiment, the memory channel can be considered as coupling to multiple buffers 260 on a multidrop bus. In one embodiment, in a multidrop scenario with multiple DIMMs (or other grouping for groups 270), and multiple buffers 260, there will be a group 270 that is the target of the command, where the target is the group 270 that stores the data for a read, or is to store the data for a write. The other groups 270 will be non-target groups 270. In one embodiment, non-target groups 270 terminate the signals transferred to reduce signal reflections, which improves signal quality for the target group 270. In one embodiment, the termination includes synchronous termination. In one embodiment, buffer 260 includes a counter to count pulses transferred to ensure good termination and performance.

As described, in one embodiment, system 200 includes one or more groups 270 of NVM devices 272. Each group 270 can include multiple NVM devices 272. Storage controller 240 controls or manages reading and writing to NVM devices 272. One or more buffers 260, such as one buffer per group 270, is coupled between storage controller 240 and the NVM device groups 270. In one embodiment, buffer 260 is on a data bus, and re-drives data signals on the data bus, and synchronizes data signals to a clock signal. SSD 230 can include multiple buffer 260 and groups 270.

Figure 3:
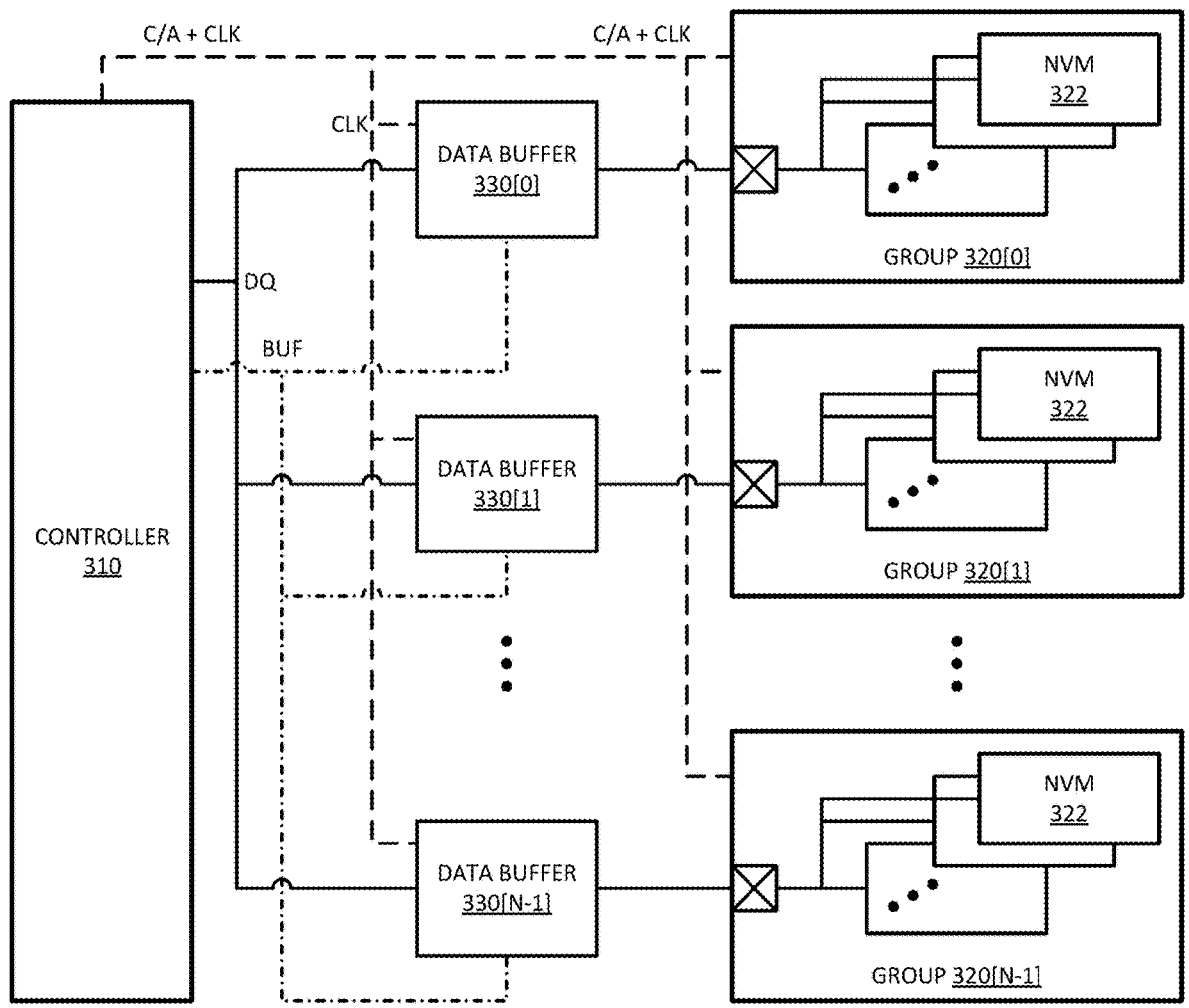
FIG. 3 is a block diagram of an embodiment of a storage system with a data buffer.

FIG. 3 is a block diagram of an embodiment of a storage system with a data buffer. System 300 illustrates an example of a storage controller and NVM devices in accordance with an embodiment of either or both of system 100 or system 200. In one embodiment, system 300 represents an SSD. Controller 310 represents the storage controller. System 300 includes groups 320[0] through 320[N-1], which for convenience can be simply referred to as group 320 or groups 320. Groups 320 each include multiple NVM devices 322. In one embodiment, each group 320 includes the same number of NVM devices 322, although such a configuration may not be necessary for some implementations.

System 300 includes a data buffer that corresponds with each group 320. Thus, system 300 is illustrated with data buffers 330[0] through 330[N-1], corresponding respectively to groups 320[0] through 320[N-1]. Similar to groups 320, for convenience data buffers 330[0] through 330[N-1] can be simply referred to as data buffer 330 or data buffers 330.

The lines interconnecting controller 310 to data buffers 330 and groups 320 represent signal lines of a memory channel for system 300. In one embodiment, the memory channel includes a command and address (C/A) bus, where typically the address information is included in one or more fields of information provided with command information. The address identifies the memory location to which the memory transaction indicated by the command should be applied. C/A bus is represented by a line with long dashes. The memory channel of system 300 includes a data (DQ)

bus, which enables the transfer of data from controller 310 to NVM devices 322 for a write, and from NVM devices 322 to controller 310 for a read. The data bus is represented by a solid line. In one embodiment, the memory channel includes a buffer command bus (represents as BUF in system 300, but which could be designated by a different label). The buffer command bus is represented by a dashed-dotted line.

System 300 provides reduced loading to the memory channel at controller 310, which can enable high bandwidth and high capacity SSD implementations without adding memory channels. In one embodiment, the data bus couples from controller 310 to data buffers 330, which can adjust the DQS (data strobe) and DQ (data) signals to account for propagation delays to/from or between controller 310 and NVM devices 320. In one embodiment, buffers 330 can adjust the DQS and DQ data signals to account for voltage variations, temperature variations, process variations, or a combination.

In one embodiment, the clock signal used to transfer the C/A signals can be coupled to data buffers 330. Data buffers 330 can re-time the data signals and synchronize the transfer of the data signals based on the timing of the clock signal for the commands in system 300. The command and address information as well as the clock can be coupled to groups 320 of NVM devices 322. In one embodiment, controller 310 controls the timing of signals to data buffers 330 via the buffer command bus. For example, based on the timing of signals to data buffers 330 and the timing of the transactions themselves, controller 310 can enable system 300 to comply with one or more protocols.

In one embodiment, controller 310 sends back to back data access commands to NVM devices 322, which the NVM devices interpret as a single command of double length. Data buffers 330 can buffer the data between controller 310 and NVM devices 322, which can enable the transfer of two consecutive BLs of data as a single BL. For example, in one embodiment, data buffers 330 support a DDR4 protocol configured for BL8, and NVM devices 322 include 3DXP devices, which operate in accordance with a 3DXP protocol configured to BL16. In one embodiment, data buffers 330 transfer 16 bytes instead of 8 bytes. In one embodiment, data buffers 330 can skip the second command internally and continue bursting the second burst length of data (e.g., first transfer 8 bytes and continue transferring a second 8 bytes) without stall cycles. In addition to NVM devices 322 treating double an amount of data signals as a single transaction, the data buffers can likely be triggered to operate for double the number of BL cycles.

It will be understood that data buffers 330 provide different functions than a passive switch used in NAND SSDs that fans out the SSD write data to the selected memory die. As described herein, data buffers 330 can broadcast data to all connected dies. In one embodiment, NVM devices 322 follow fixed write and read protocol timings and latencies, such as deterministic data transfer. Traditional NAND devices follow the ONFI (open NAND flash interface) protocol, which traditionally waits for a data to be ready before transfer. The ONFI protocol does not provide deterministic data transfer. As described herein, NAND NVM devices can be used with data buffers 330 to provide load reduced data transfer.

In one embodiment, controller 310 sends command and address data to NVM devices 322 prior to sending buffer command signals to data buffers 330. In one embodiment, the buffer command signals can be referred to one or more control signals, which will trigger a data buffer 330 to transfer the data signals to the an associated group 320 of NVM devices 322. In one embodiment, the buffer command signals can be referred to one or more control signals, which will trigger a data buffer 330 to transfer the data signals from an associated group 320 of NVM devices 322. In one embodiment, the buffer command signals can synchronize the data signals to the transfer cycles of the clock signal from the command and address and clock information. In one embodiment, data buffers 330 can synchronize the data signals to a protocol timing of an interface of NVM devices 322. In one embodiment, data buffers 330 can synchronize the data signals to a protocol timing of a storage controller interface.

Figure 4:
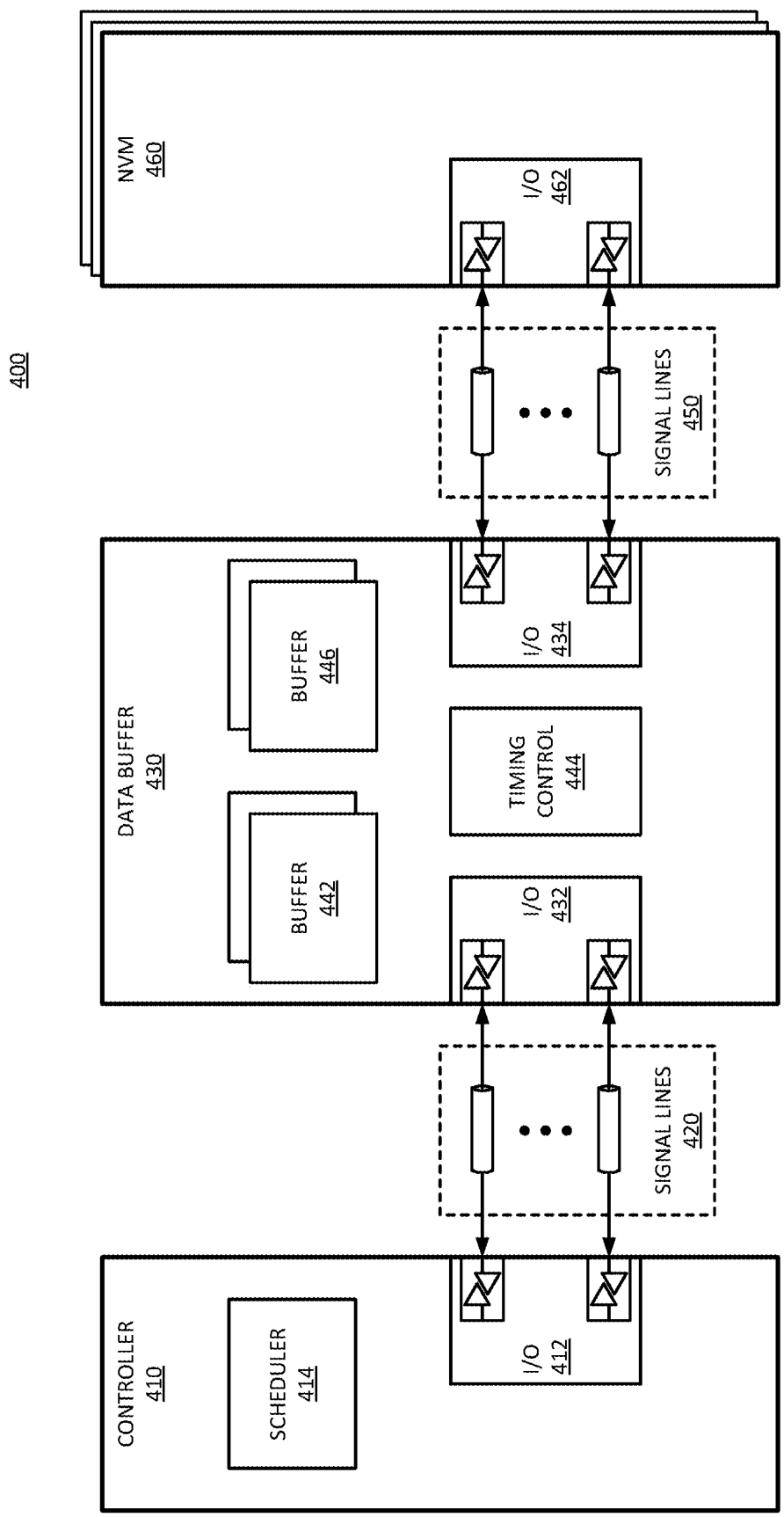
FIG. 4 is a block diagram of an embodiment of a data buffer with trainable host side and memory side interfaces.

FIG. 4 is a block diagram of an embodiment of a data buffer with trainable host side and memory side interfaces. System 400 illustrates components of a storage system in accordance with an embodiment of system 100, system 200, or system 300. System 400 includes controller 410, which represents a storage controller. System 400 includes NVM devices 460, which represents nonvolatile media.

System 400 specifically illustrates input/output (I/O) interface logic 412 in controller 410, which interfaces the storage controller with data buffer 430, and more specifically to I/O interface logic 432. I/O interface logic 432 represents a host-side or host facing interface for data buffer 430, while I/O interface logic 412 represents a memory side or memory facing interface for controller 410. Data buffer 430 includes I/O interface logic 434 to interface with NVM devices 460, and more specifically to I/O interface logic 462. I/O interface logic 462 represents a host-side or host facing interface for NVM devices 460, while I/O interface logic 434 represents a memory side or memory facing interface for data buffer 430. For convenience, I/O interface logic may be referred to herein simply as I/O, such as I/O 412, I/O 432, I/O 434, and I/O 462.

Signal lines 420 represent the signal lines or bus or buses that couple controller 410 to data buffer 430. Signal lines 450 represent the signal lines or bus or buses that couple data buffer 430 to NVM devices 460. A bus can include at least one of command signal lines, data signal lines, strobe signaling lines, alert lines, auxiliary lines, or other signal lines, or a combination. It will be understood that system 400 illustrates a data bus, which is buffered by data buffer 430. A command bus could also be buffered by a command buffer (not explicitly shown), or could be coupled in a point to point network to NVM devices 460 (not explicitly shown).

I/O interface logic can include pins, pads, connectors, signal lines, traces, or wires, or other hardware to connect the devices, or a combination of these. I/O interface logic can include a hardware interface. As illustrated, I/O interface logic can include at least drivers/transceivers for signal lines to drive the signal lines (420, 450) to desired voltage levels. Commonly, wires within an integrated circuit interface couple with a pad, pin, or connector to interface signal lines or traces or other wires between devices. I/O interface logic can include drivers, receivers, transceivers, or termination, or other circuitry or combinations of circuitry to exchange signals on the signal lines between the devices. The exchange of signals includes at least one of transmit or receive.

Controller 410 is illustrated including scheduler 414, which represents logic in the controller to control the timing of sending command signals to NVM 460. While command signal lines are not explicitly shown in system 400, controller sends commands to NVM 460 for data access. In one embodiment, controller 410 sends buffer commands to data buffer 430 that are separate from the data access commands, and can control how data buffer 430 handles data related to a data access command.

Data buffer 430 is illustrated including one or more buffers 442, which represent data buffers to enable the transfer of data between controller 410 and NVM 460 with reduced loading. In one embodiment, write data enters data buffer 430 via I/O 432, and is placed in buffer 442. Data buffer 430 transfers the write data out I/O 434 in response to one or more command signals or one or more clock signals, or both. In one embodiment, data buffer 430 includes timing control 444 to adjust the timing of data signals. Thus, data buffer 430 can re-time the data signals based on control logic of timing control 444 in response to commands or clock signals or both, which enables data buffer 430 to ensure compliance of the memory channel with one or more protocols. For read data, in one embodiment, NVM 460 sends the read data to data buffer 430, which receives it via I/O 434 and places it in buffer 442. Timing control 444 can represent timing control to send the read data to controller 410 from buffer 442 via I/O 432. Timing control 444 can enable data buffer 430 to provide a deterministic, high speed storage interface. In one embodiment, system 400 can include 3DXP NVM 460 operating at DDR4 frequencies. Timing control 444 can ensure that the interface with controller 410 operates in accordance with DDR4 signals, while also complying with 3DXP timing protocols for the interface with NVM 460.

It will be understood that I/O interfaces 412, 432, 434, and 462 exchange signals by driving signal lines 420 and 450 to desired logic levels, such as driving a signal line to low voltage threshold for a '0' or logic low and driving a signal line to a high voltage threshold for a '1' or logic high. The voltage thresholds can vary based on the implementation, but in general there is a signal eye that defines signals that can be properly decoded on the other side, where the eye includes a threshold high or low level, and threshold rise and fall times. Various configuration settings can affect the signal eye, such as voltage levels, current levels, temperature, delay for driving and receiving the signal, and other settings, as is understood in the art. I/O interfaces typically engage in "handshaking" or other configuration processes to train the signal eye. Training the signal eye refers to adjusting configuration settings to achieve a signal eye that enables signal transfer with a maximum threshold of errors per time period.

It will be understood that signal eye training can be different for different protocols, given the different timing expected for the different protocols, and given the different electrical characteristics that occur depending on how long the burst length is or what type of signals are being sent. In one embodiment, the components of system 400 include training state machines to execute a training routine or routines, and can include registers or other storage locations to store variables or configuration settings determined with the training routines. In one embodiment, different training routines can be used to train data buffer 430 to ensure that data buffer 430 complies with a host facing memory channel protocol, and complies with a memory facing memory channel protocol. For example, data buffer 430 could be trained for DDR4 timing for host side exchanges, and for 3DXP timing for memory side exchanges.

In one embodiment, data buffer 442 includes one or more registers 446, which can be or include multipurpose registers (MPRs). In one embodiment, controller 410 writes data to one or more registers 446 for training. In one embodiment, data buffer 430 applies the data from registers 446 to train the interface with NVM 460. Data buffer 430 can apply different configuration settings with the data in an iterative manner to find configuration settings that provide threshold performance (e.g., data transfer with a maximum number of errors per time period or per number of transfer cycles). The configuration settings can include at least one timing setting for timing controller 444. In one embodiment, training can enable the timing for data buffer 430 to re-drive write data in accordance with a protocol timing for NVM 460 or I/O interface logic 462 of NVM 460. In one embodiment, training can enable the timing for data buffer 430 to re-drive read data in accordance with a protocol timing for controller 410 or I/O interface logic 412 of controller 410.

Figure 5:
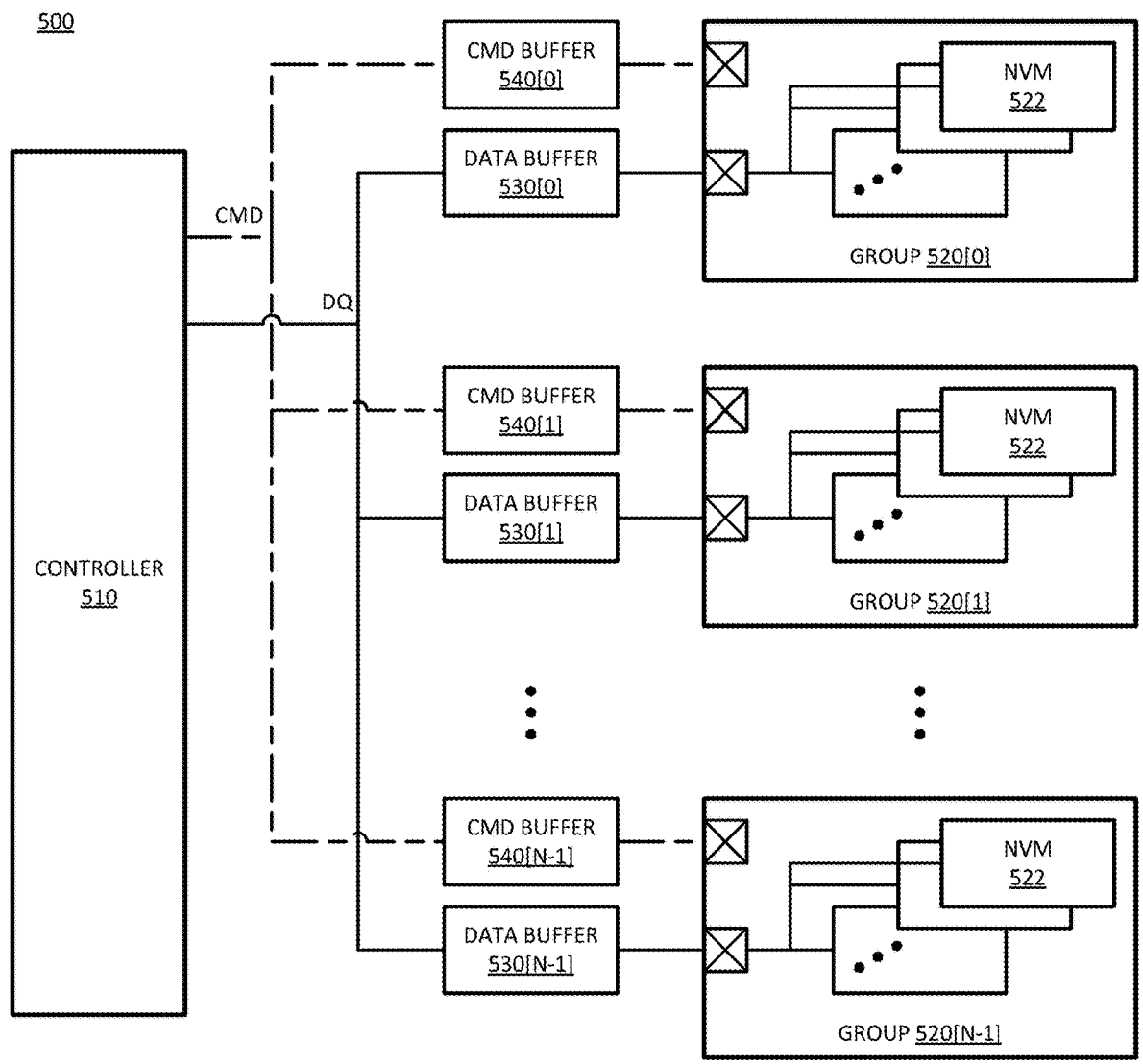
FIG. 5 is a block diagram of an embodiment of a storage system with a data buffer and a command buffer.

FIG. 5 is a block diagram of an embodiment of a storage system with a data buffer and a command buffer. System 500 illustrates an example of a storage controller and NVM devices in accordance with an embodiment of either or both of system 100 or system 200. System 500 can provide an example of a system in accordance with system 300. In one embodiment, system 500 represents an SSD. Controller 510 represents the storage controller. System 500 includes groups 520[0] through 520[N-1], which for convenience can be simply referred to as group 520 or groups 520. Groups 520 each include multiple NVM devices 522. In one embodiment, each group 520 includes the same number of NVM devices 522, although such a configuration may not be necessary for some implementations.

System 500 includes a data buffer that corresponds with each group 520. Thus, system 500 is illustrated with data buffers 530[0] through 530[N-1], corresponding respectively to groups 520[0] through 520[N-1]. Similar to groups 520, for convenience data buffers 530[0] through 530[N-1] can be simply referred to as data buffer 530 or data buffers 530. In one embodiment, system 500 includes command buffers 540[0] through 540[N-1], corresponding respectively to groups 520[0] through 520[N-1]. For convenience command buffers 540[0] through 540[N-1] can be simply referred to as command buffer 540 or data command buffers 540.

The lines interconnecting controller 510 to data buffers 530, command buffers 540, and groups 520 represent signal lines of a memory channel for system 500. For simplicity, only command and data signals lines are specified in system 500. In one embodiment, the memory channel includes a command and address (C/A) bus, illustrated as CMD or command bus, represented by a line with long and short dashes. The memory channel of system 500 includes a data (DQ) bus, which enables the transfer of data from controller 510 to NVM devices 522 for a write, and from NVM devices 522 to controller 510 for a read. The data bus is represented by a solid line. In one embodiment, system 500 will include one or more buffer command buses, to data buffers 530 or to command buffers 540 or to both.

System 500 provides reduced loading to the memory channel for both the data bus and the command bus. In one embodiment, the data bus couples from controller 510 to data buffers 530, which can adjust the DQS (data strobe) and DQ (data) signals to account for propagation delays, voltage variations, temperature variations, process variations, or a combination. In one embodiment, the command bus couples from controller 510 to command buffers 540, which can adjust the command timing to account for propagation delays or one or more variations.

In one embodiment, controller 310 sends command and address data to NVM devices 322 prior to sending buffer command signals to data buffers 330. In one embodiment, the buffer command signals can be referred to one or more control signals, which will trigger a data buffer 330 to transfer the data signals to the an associated group 320 of NVM devices 322. In one embodiment, the buffer command signals can be referred to one or more control signals, which will trigger a data buffer 330 to transfer the data signals from an associated group 320 of NVM devices 322. In one embodiment, the buffer command signals can synchronize the data signals to the transfer cycles of the clock signal from the command and address and clock information. In one embodiment, data buffers 330 can synchronize the data signals to a protocol timing of an interface of NVM devices 322. In one embodiment, data buffers 330 can synchronize the data signals to a protocol timing of a storage controller interface.

Figure 6:
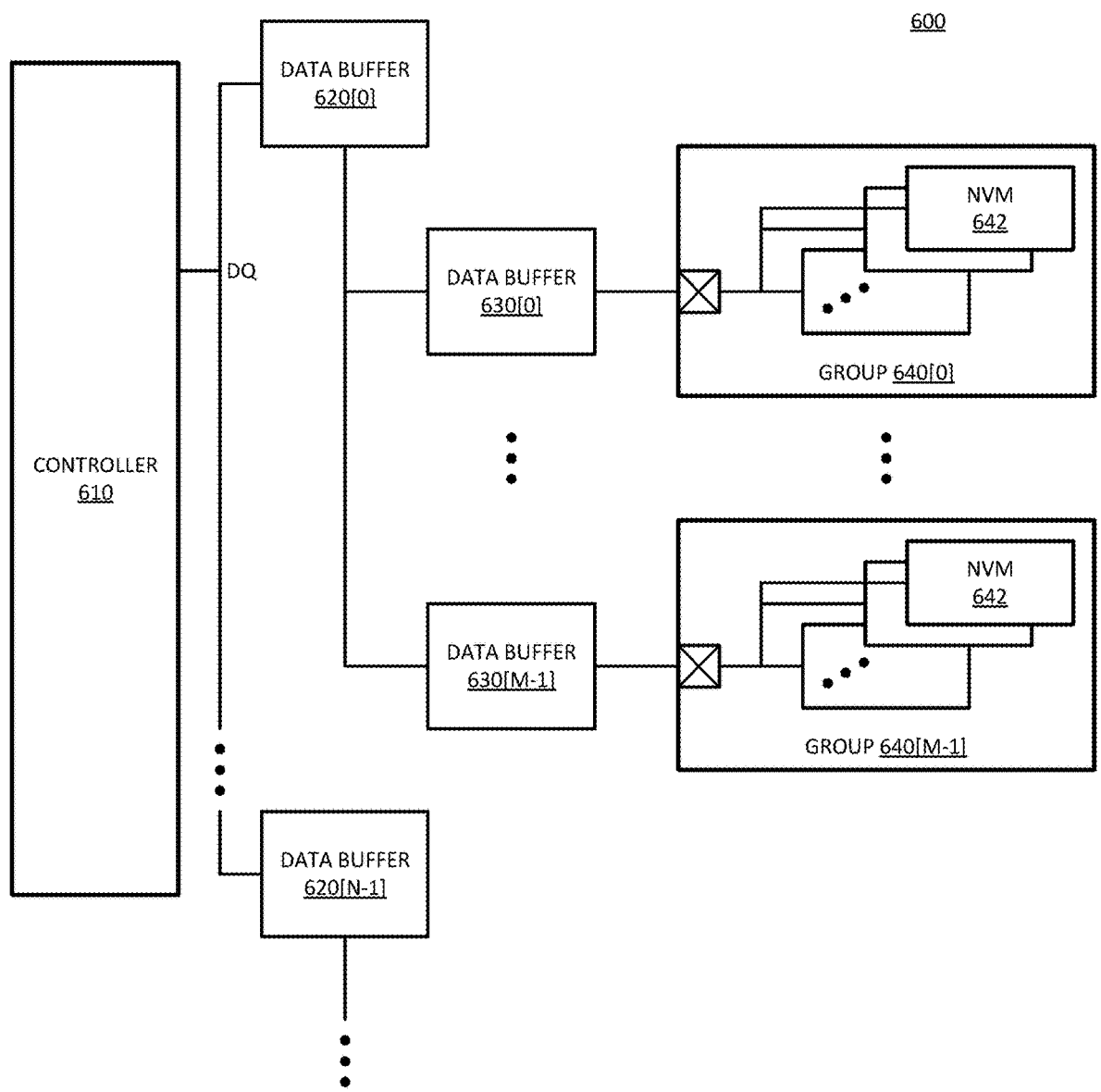
FIG. 6 is a block diagram of an embodiment of a storage system with cascaded data buffers.

FIG. 6 is a block diagram of an embodiment of a storage system with cascaded data buffers. System 600 illustrates an example of a storage controller and NVM devices in accordance with an embodiment of either or both of system 100 or system 200. System 600 can provide an example of a system in accordance with system 300. System 600 illustrates how to make an ultra-high capacity nonvolatile storage device or ultra-high capacity SSD.

Controller 610 represents the storage controller for the storage system. System 600 includes multiple layers of data buffers. While different structures can be used, more than two layers of data buffers can be used, system 600 illustrates a tree structure in which data buffers can be organized in a hierarchy. Thus, one or more data buffers can couple on the "memory side interface" to a downstream data buffer. For example, data buffer 620[0] couples downstream to data buffers 630[0] through 630[N-1]. For convenience, data buffers 620[0] through 620[N-1] and data buffers 630[0] through 630[N-1] can be simply referred to, respectively, as data buffer 620 or data buffers 620, or data buffer 630 or data buffers 630. In accordance with an embodiment of system 600, one or more data buffers can couple on the "host side interface" to an upstream data buffer instead of directly to controller 610. For example, data buffers 630 couple upstream to data buffer 620[0]. Data buffer 620[N-1] and data buffers 620[1] through 620[N-2] can also be understood to couple to one or more groups of NVM devices. In one embodiment, one or more of data buffers 620 can couple directly to a group of NVM devices, without an intervening data buffer layer such as data buffers 630. Thus, the cascading arrangement or tree structure of system 600 is flexible.

System 600 includes groups 640[0] through 640[N-1], which for convenience can be simply referred to as group 640 or groups 640. Groups 640 each include multiple NVM devices 642. In one embodiment, each group 640 includes the same number of NVM devices 642, although such a configuration may not be necessary for some implementations. For simplicity in the illustration and description, system 600 only illustrates a data bus (DQ) between controller 610 and NVM devices 642. It will be understood that system 600 includes appropriate command and address buses, control buses, or a combination as necessary to exchange control and commands related to exchanging the data over the data bus. Data exchanges occur in response to data access commands. Data exchanges are controlled by control operations of data buffers 630 and data buffers 620.

In one embodiment, multiple data buffers 620 can be cascaded in a daisy chain on a PCB, or a multi-ganged PCB circuit (e.g., with one or more jumper boards coupled to one or more connectors). The cascading of system 600 enables very high capacity solid state storage systems at the same or similar performance as traditional SSDs, without adding memory channels to controller 610. It will be understood that adding a data buffer introduces some latency, and adding multiple layers of data buffers adds additional latency. However, latency added through a buffer layer is small (e.g., 1.6 ns), while the decreased loading allows for increased frequency operation, which tends to more than compensate for the added latency in the data buffers. The scheduling and issuing of commands to NVM devices 642 (and other NVM devices not specifically illustrated), as well as the scheduling and issuing of commands, including buffer control signals, can adjust for the delays introduced by data buffers 620 and 630.

Figure 7A:
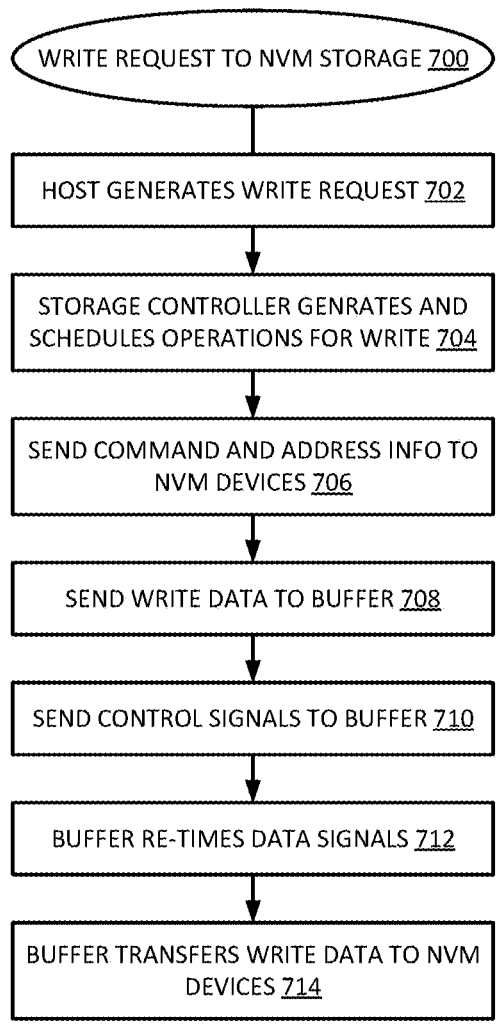
FIG. 7A is a flow diagram of an embodiment of a process for accessing data in a multilevel memory.

FIG. 7A is a flow diagram of an embodiment of a process for accessing data in a multilevel memory. Process 700 provides an example of operations for issuing a write request to NVM storage that has a buffered data bus in the memory channel in accordance with an embodiment of a data storage system, such as system 100, system 200, or others. The execution of processes and operations by the host generates a write request to store data to the NVM storage, 702. In one embodiment, the storage controller generates and schedules operations to accomplish the write, 704. The write refers to a write transaction, where the storage controller sends one or more commands to the NVM devices, and sends data to write to a specific memory address. The data for the write is sent over multiple transfer cycles.

In one embodiment, as the first part of the write transaction, the storage controller sends command and address information to the NVM devices, 706. Sending the command and address information can enable the command and address information to the NVM devices prior to when data begins to reach the NVM devices. In one embodiment, the storage controller sends the write data to the data buffer, 708, and sends control signals to the data buffer after sending the command and address information to the NVM devices, 710. The control signals configure the data buffer to transfer the data to the NVM devices. The control signals can be or include a buffer command or buffer command sequence.

In one embodiment, at least partially in response to a control signal from the storage controller, the data buffer re-times the data signals, 712. Re-timing the data signals can include adjusting delay, signaling parameters, or other re-timing to cause the data signals to be compliant with a protocol. In one embodiment, re-timing includes synchronizing the data signals to a clock signal for timing associated with the NVM devices (e.g., a memory side interface). In one embodiment, the NVM devices operate on a native protocol that is different than the native protocol of the interface of the storage controller with the host. The data buffer transfers the write data to the NVM devices in accordance with the timing, 714.

In one embodiment, the storage controller provides a buffer command for every data access command sent to the NVM devices. In one embodiment, the storage controller sends multiple consecutive buffer commands for every data access command sent to the NVM devices. In one embodiment, the NVM devices will expect 2N transfer cycles worth of data for a write, and the data buffer would normally send N transfer cycles of data in response to a command. In such an embodiment, the consecutive commands can cause the data buffer to send 2N transfer cycles of data to the NVM devices as a single command transaction. In one embodiment, the data buffer can internally eliminate any delay between the first N transfer cycles of data and the second N transfer cycles of data.

Figure 7B:
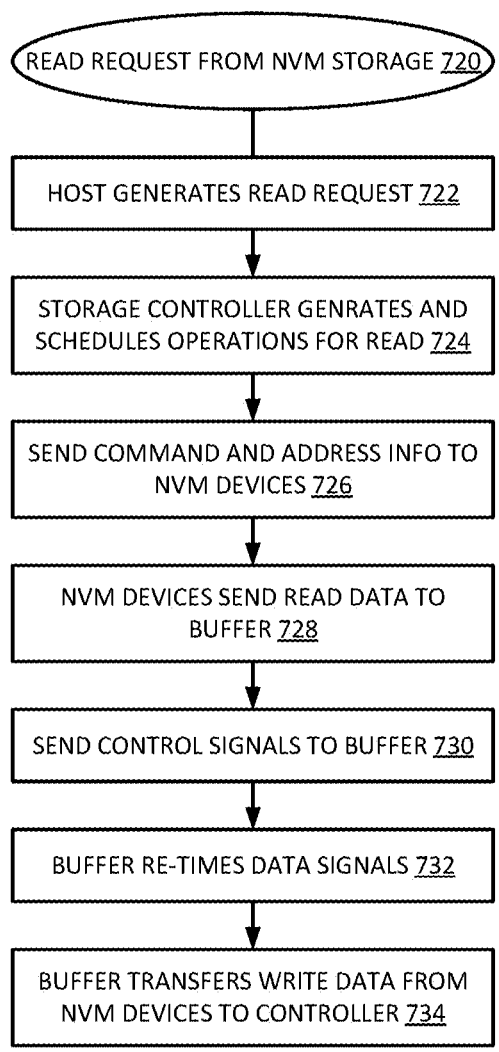
FIG. 7B is a flow diagram of an embodiment of a process for processing a read access request in a system with a high compressibility flag.

FIG. 7B is a flow diagram of an embodiment of a process for processing a read access request in a system with a high compressibility flag. Process 720 provides an example of operations for issuing a read request to NVM storage that has a buffered data bus in the memory channel in accordance with an embodiment of a data storage system, such as system 100, system 200, or others. The execution of processes and operations by the host generates a read request to access data from the NVM storage, 722. In one embodiment, the storage controller generates and schedules operations to accomplish the read, 704. The read refers to a read transaction, where the storage controller sends one or more commands to the NVM devices, and in response to the command, the NVM devices send data from a specific memory address to the storage controller to provide to the host. The data for the read is sent over multiple transfer cycles.

In one embodiment, as the first part of the read transaction, the storage controller sends command and address information to the NVM devices, 726. Sending the command and address information can enable the command and address information to the NVM devices prior to when the data buffer is prepared to transfer data from the NVM devices to the storage controller. In one embodiment, the NVM devices send the read data to the data buffer, 728, and send control signals to the data buffer after sending the command and address information to the NVM devices, 730. The control signals configure the data buffer to transfer the data from the NVM devices to the storage controller. The control signals can be or include a buffer command or buffer command sequence.

In one embodiment, at least partially in response to a control signal from the storage controller, the data buffer re-times the data signals, 732. Re-timing the data signals can include adjusting delay, signaling parameters, or other re-timing to cause the data signals to be compliant with a protocol. In one embodiment, re-timing includes synchronizing the data signals to a clock signal for timing associated with the storage controller (e.g., a host side interface). In one embodiment, the NVM devices operate on a native protocol that is different than the native protocol of the interface of the storage controller with the host. The data buffer transfers the read data to the storage controller in accordance with the timing, 734.

In one embodiment, the storage controller provides a buffer command for every data access command sent to the NVM devices. In one embodiment, the storage controller sends multiple consecutive buffer commands for every data access command sent to the NVM devices. In one embodiment, the NVM devices send 2N transfer cycles worth of data for a single read transaction, and the data buffer would normally expect to receive N transfer cycles of data in response to a command. In such an embodiment, the consecutive commands can cause the data buffer to receive 2N transfer cycles of data from the NVM devices as a single read transaction. In one embodiment, the data buffer can internally eliminate any delay between the first N transfer cycles of data and the second N transfer cycles of data. In one embodiment, the data buffer transfers the data out as two separate N transfer cycles of data to the storage controller.

Figure 7C:
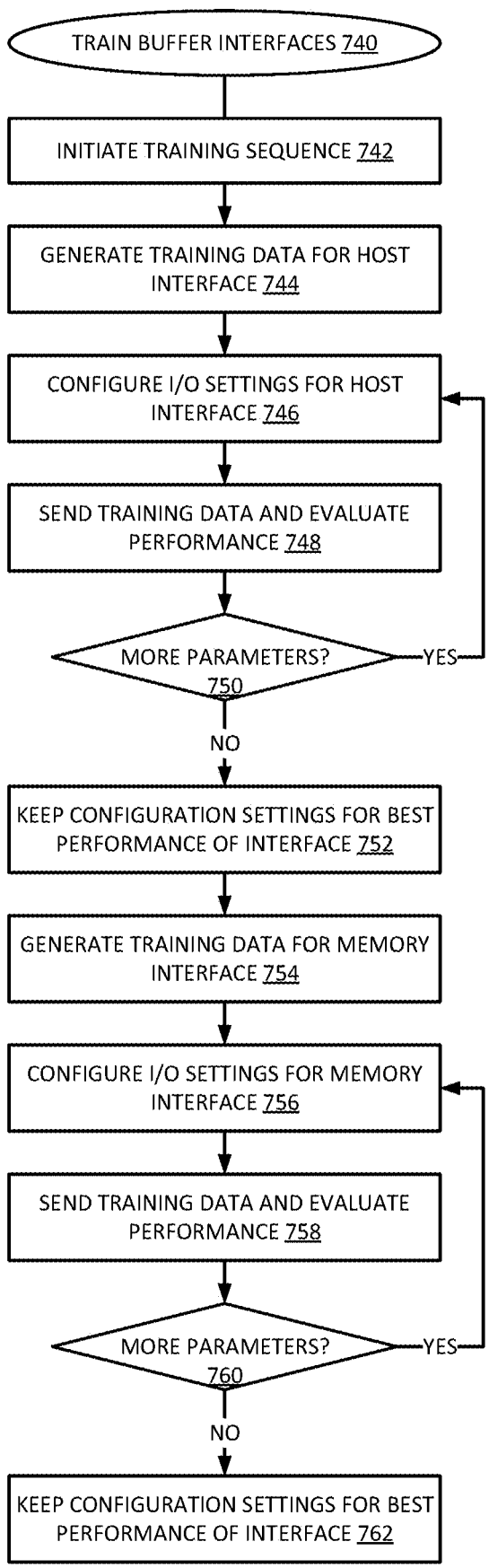
FIG. 7C is a flow diagram of an embodiment of a process for processing a write access request in a system with a high compressibility flag.

FIG. 7C is a flow diagram of an embodiment of a process for processing a write access request in a system with a high compressibility flag. Process 740 provides an example of operations for training the interfaces of a buffer (e.g., a data buffer or a command buffer) for an NVM storage system that has a buffered data bus in the memory channel in accordance with an embodiment of a data storage system, such as system 100, system 200, or others. In one embodiment, a condition or event causes the initiation of a training sequence, 742. For example, the system can train I/O interfaces upon a reset condition, whether initial boot of a machine, or waking from sleep or low power mode. In one embodiment, the storage system trains both a host side interface of the buffer and a memory side interface of the buffer. The timing parameters may be different on the host side and the memory side, especially when different protocols are used in the NVM devices from the storage controller managing the channel.

In one embodiment, the storage controller generates training data for the host interface of the buffer, 744. In one embodiment, the data buffer configures I/O settings for the host interface, 746, which can include setting one or more value(s) that control timing of signal between the storage controller and the data buffer. The storage controller can iteratively send training data and evaluate the performance of the transaction, 748, and determine if there are other configuration settings to test for the I/O interface, 750. If there are more settings to evaluate, 750 YES branch, the data buffer configures the I/O settings for another data transfer, 746. If the last configuration setting has been evaluated, 750 NO branch, in one embodiment, the data buffer keeps configuration settings for the I/O interface settings that provided the best performance of the ones evaluated, 752.

In one embodiment, the storage controller first trains the host side interface of the data buffer, and then trains the memory side interface. However, the order can be reversed, or the two trainings can occur at substantially the same time. In one embodiment, the storage controller generates training data for the memory interface of the data buffer, 754. The training data can be the same data or different data than what was used to train the host side interface. In one embodiment, the storage controller can write fixed data patterns to a register on the data buffer via the host interface, which the data buffer can then use to train the memory interface of the data buffer. In one embodiment, the data buffer configures I/O settings for the memory interface, similar to the configuration to train the host interface, 756. The data buffer can iteratively send training data to the NVM devices over the memory interface and evaluate the performance of the transaction, 758, and determine if there are other configuration settings to test for the I/O interface, 760. If there are more settings to evaluate, 760 YES branch, the data buffer configures the I/O settings for another data transfer, 756. If the last configuration setting has been evaluated, 760 NO branch, in one embodiment, the data buffer keeps configuration settings for the I/O interface settings that provided the best performance of the ones evaluated, 762.

Figure 8:
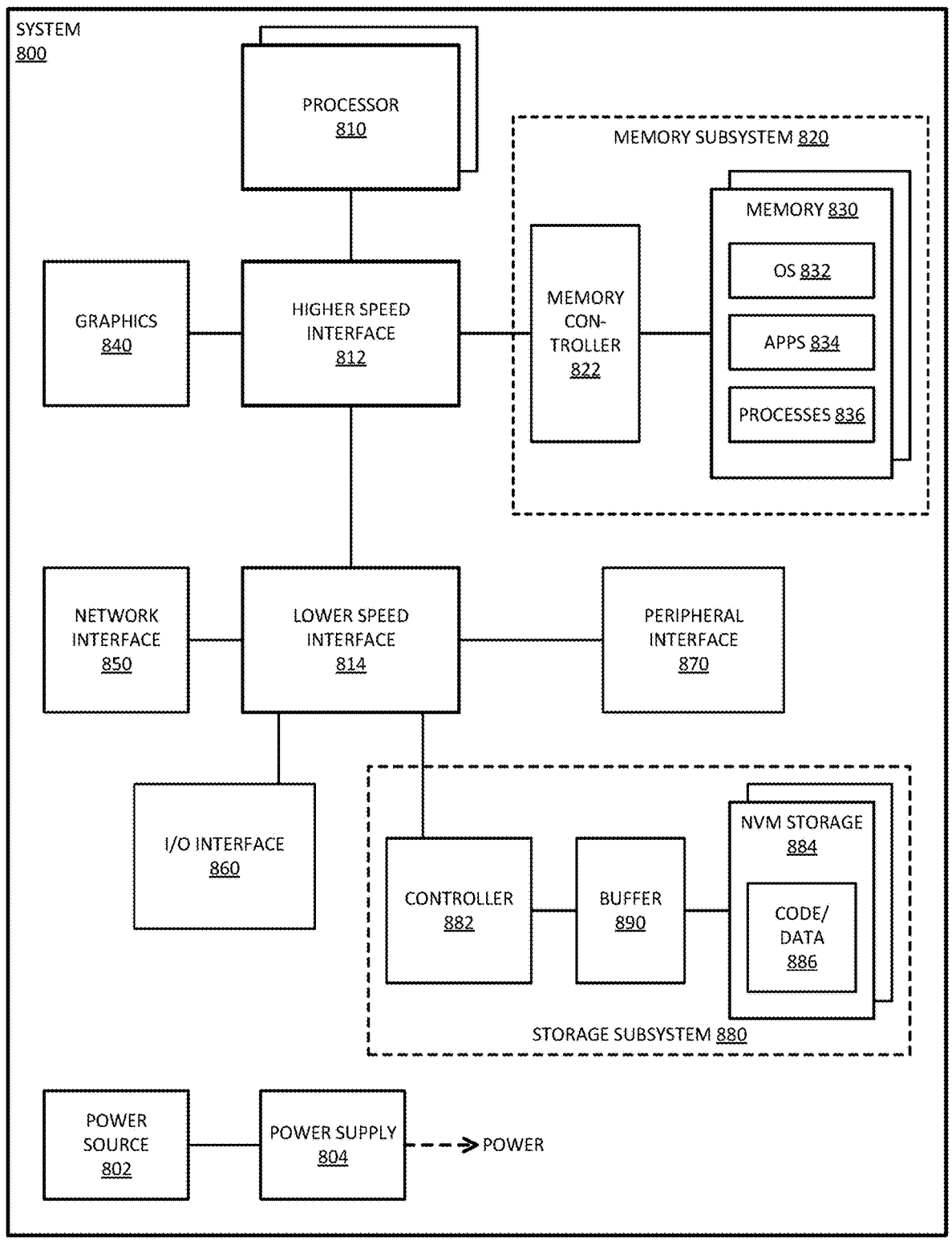
FIG. 8 is a block diagram of an embodiment of a computing system with a multilevel memory in which high compressibility flags can be implemented.

FIG. 8 is a block diagram of an embodiment of a computing system with a multilevel memory in which high compressibility flags can be implemented. System 800 represents a computing device in accordance with any embodiment described herein, and can be a laptop computer, a desktop computer, a server, a gaming or entertainment control system, a scanner, copier, printer, routing or switching device, embedded computing device, or other electronic device.

System 800 includes processor 810, which provides processing, operation management, and execution of instructions for system 800. Processor 810 can include any type of microprocessor, central processing unit (CPU), graphics processing unit (GPU), processing core, or other processing hardware to provide processing for system 800, or a combination of processors. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 800 includes interface 812 coupled to processor 810, which can represent a higher speed interface or a high throughput interface for system components that needs higher bandwidth connections, such as memory subsystem 820 or graphics interface components 840. Interface 812 can represent a "north bridge" circuit, which can be a standalone component or integrated onto a processor die. Graphics interface 840 interfaces to graphics components for providing a visual display to a user of system 800. In one embodiment, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more memory devices 830 such as read-only memory (ROM), flash memory, one or more varieties of random access memory (RAM), or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide logic to provide functions for system 800. In one embodiment, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 800 includes interface 814, which can be coupled to interface 812. Interface 814 can be a lower speed interface than interface 812. In one embodiment, interface 814 can be a "south bridge" circuit, which can include standalone components and integrated circuitry. In one embodiment, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, USB (universal serial bus), or other wired or wireless standards-based or proprietary interfaces. Network interface 850 can exchange data with a remote device, which can include sending data stored in memory or receiving data to be stored in memory.

In one embodiment, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one embodiment, system 800 includes storage subsystem 880 to store data in a nonvolatile manner. Storage subsystem 880 includes NVM storage device(s) 884, which can be or include any solid state memory devices that enable access over a high speed memory channel. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800).

In one embodiment, storage subsystem 880 includes controller 882 to interface with storage 884. In one embodiment, controller 882 can be in addition to a storage control circuit that is part of interface 814 or processor 810, or can include circuits or logic in both processor 810 and interface 814. In one embodiment, storage subsystem 880 includes buffer 890, which represents a buffer for a memory channel of a storage system in accordance with any embodiment described herein. Buffer 890 can represent a data buffer or a buffer for command and address signals, or both. Buffer 890 re-times signals between controller 882 and NVM storage 884, in accordance with any embodiment described herein.

Power source 802 provides power to the components of system 800. More specifically, power source 802 typically interfaces to one or multiple power supplies 804 in system 802 to provide power to the components of system 800. In one embodiment, power supply 804 includes an AC to DC (alternating current to direct current) adapter to plug into a wall outlet. Such AC power can be renewable energy (e.g., solar power) power source 802. In one embodiment, power source 802 includes a DC power source, such as an external AC to DC converter. In one embodiment, power source 802 or power supply 804 includes wireless charging hardware to charge via proximity to a charging field. In one embodiment, power source 802 can include an internal battery or fuel cell source.

System 800 illustrates cache controller 890 in memory subsystem 820, which represents a cache controller that includes and uses high compressibility flags in accordance with any embodiment described herein. Cache controller 890 can be understood to be part of a multilevel memory with a cache (not specifically shown) as well as memory 830. In one embodiment, cache controller 890 includes on resource HC flags that can be accessed with lower latency than a cache data store. In one embodiment, cache controller 890 is integrated on processor 810 or interface 812. In one embodiment, cache controller 890 is part of memory controller 822. Cache controller 890 returns fulfillment of memory access requests for cached data based at least in part on a value of a high compressibility flag in accordance with any embodiment described herein.

Figure 9:
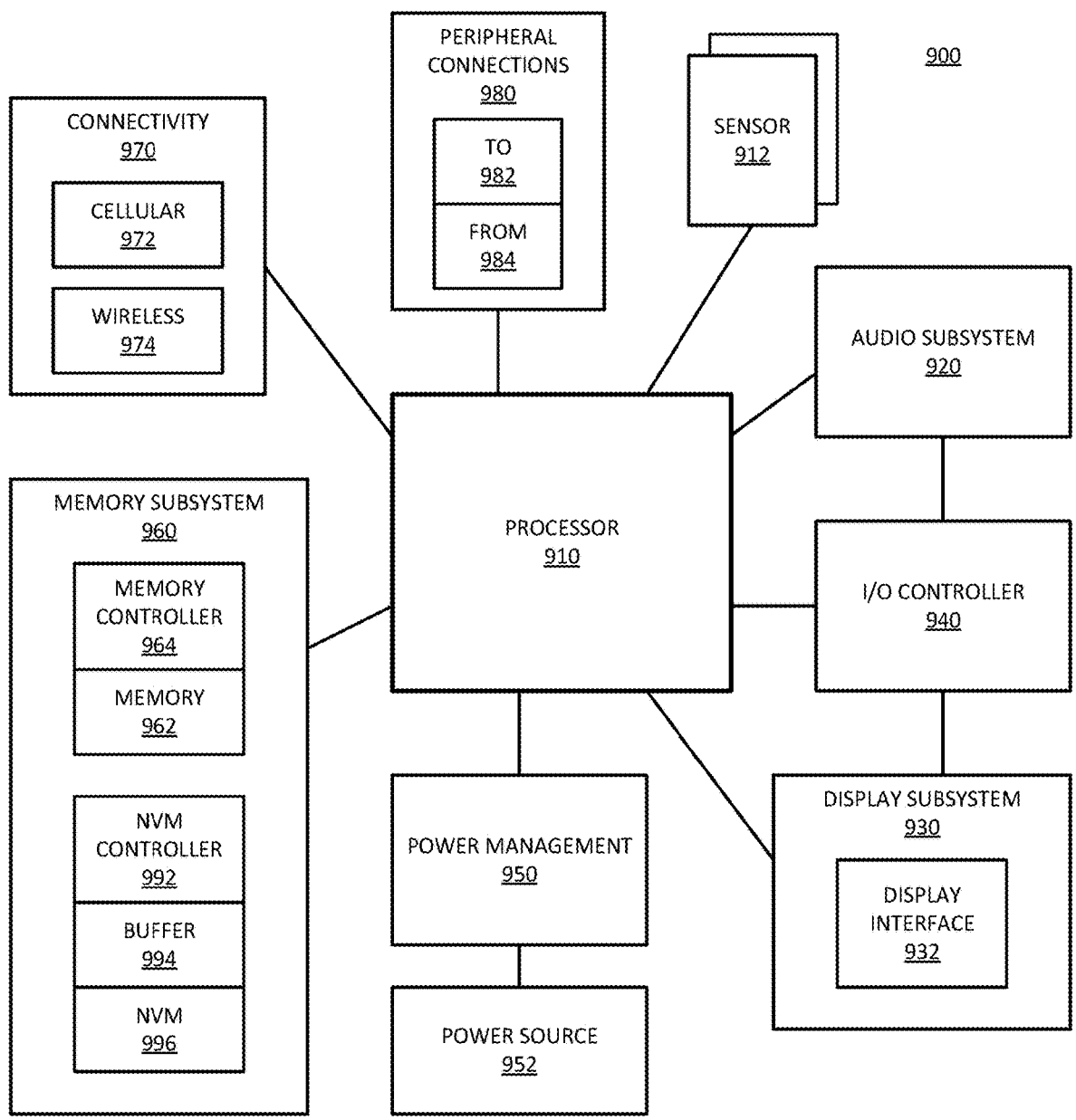
FIG. 9 is a block diagram of an embodiment of a mobile device with a multilevel memory in which high compressibility flags can be implemented.

FIG. 9 is a block diagram of an embodiment of a mobile device with a multilevel memory in which high compressibility flags can be implemented. Device 900 represents a mobile computing device, such as a computing tablet, a mobile phone or smartphone, a wireless-enabled e-reader, wearable computing device, or other mobile device, or an embedded computing device. It will be understood that certain of the components are shown generally, and not all components of such a device are shown in device 900.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting device 900 to another device, or a combination. The processing operations can also include operations related to audio I/O, display I/O, or other interfacing, or a combination. Processor 910 can execute data stored in memory. Processor 910 can write or edit data stored in memory.

In one embodiment, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 912 can also include sensors for biometric systems such as fingerprint recognition systems, face detection or recognition systems, or other systems that detect or recognize user features. Sensors 912 should be understood broadly, and not limiting on the many different types of sensors that could be implemented with system 900. In one embodiment, one or more sensors 912 couples to processor 910 via a frontend circuit integrated with processor 910. In one embodiment, one or more sensors 912 couples to processor 910 via another component of system 900.

In one embodiment, device 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 900, or connected to device 900. In one embodiment, a user interacts with device 900 by providing audio commands that are received and processed by processor 910.

Display subsystem 930 represents hardware (e.g., display devices) and software components (e.g., drivers) that provide a visual display for presentation to a user. In one embodiment, the display includes tactile components or touchscreen elements for a user to interact with the computing device. Display subsystem 930 includes display interface 932, which includes the particular screen or hardware device used to provide a display to a user. In one embodiment, display interface 932 includes logic separate from processor 910 (such as a graphics processor) to perform at least some processing related to the display. In one embodiment, display subsystem 930 includes a touchscreen device that provides both output and input to a user. In one embodiment, display subsystem 930 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem 930 generates display information based on data stored in memory and operations executed by processor 910.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that can be included in device 900, or sensors 912. The input can be part of direct user interaction, as well as providing environmental input to the system to influence its operations (such as filtering for noise, adjusting displays for brightness detection, applying a flash for a camera, or other features).

In one embodiment, device 900 includes power management 950 that manages battery power usage, charging of the battery, and features related to power saving operation. Power management 950 manages power from power source 952, which provides power to the components of system 900. In one embodiment, power source 952 includes an AC to DC (alternating current to direct current) adapter to plug into a wall outlet. Such AC power can be renewable energy (e.g., solar power, motion based power). In one embodiment, power source 952 includes only DC power, which can be provided by a DC power source, such as an external AC to DC converter. In one embodiment, power source 952 includes wireless charging hardware to charge via proximity to a charging field. In one embodiment, power source 952 can include an internal battery or fuel cell source.

Memory subsystem 960 includes memory device(s) 962 for storing information in device 900. Memory subsystem 960 can include nonvolatile memory 996 (state does not change if power to the memory device is interrupted) or volatile memory devices 962(state is indeterminate if power to the memory device is interrupted), or a combination. Memory 960 can store application data, user data, music, photos, documents, or other data, as well as system data (whether long-term or temporary) related to the execution of the applications and functions of system 900. In one embodiment, memory subsystem 960 includes memory controller 964 (which could also be considered part of the control of system 900, and could potentially be considered part of processor 910). Memory controller 964 includes a scheduler to generate and issue commands to control access to memory device 962.

In one embodiment, memory subsystem 960 includes NVM controller 992, which includes a scheduler, to generate and issue commands to control access to NVM 996. In one embodiment, memory subsystem 960 includes buffer 994, which represents a buffer for a memory channel of a storage system in accordance with any embodiment described herein. Buffer 994 can represent a data buffer or a buffer for command and address signals, or both. Buffer 944 re-times signals between NVM controller 992 and NVM 996, in accordance with any embodiment described herein.

Connectivity 970 includes hardware devices (e.g., wireless or wired connectors and communication hardware, or a combination of wired and wireless hardware) and software components (e.g., drivers, protocol stacks) to enable device 900 to communicate with external devices. The external device could be separate devices, such as other computing devices, wireless access points or base stations, as well as peripherals such as headsets, printers, or other devices. In one embodiment, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading, uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

System 900 illustrates cache controller 990 in memory subsystem 960, which represents a cache controller that includes and uses high compressibility flags in accordance with any embodiment described herein. Cache controller 990 can be understood to be part of a multilevel memory with a cache (not specifically shown) as well as memory 962. In one embodiment, cache controller 990 includes on resource HC flags that can be accessed with lower latency than a cache data store. In one embodiment, cache controller 990 is integrated on processor 910. In one embodiment, cache controller 990 is part of memory controller 964. Cache controller 990 returns fulfillment of memory access requests for cached data based at least in part on a value of a high compressibility flag in accordance with any embodiment described herein.

In one aspect, a system for data storage includes: a group of nonvolatile memory (NVM) devices; a storage controller coupled to the group of NVM devices, the storage controller to manage reading and writing to the NVM devices; and a data buffer coupled between the group of NVM devices and the storage controller on a data bus, the data buffer to re-drive data signals on the data bus, and synchronize data signals to a clock signal.

In one embodiment, the storage controller is to first send a command signal to the group of NVM devices, and next send a control signal to the data buffer, wherein the control signal is to trigger the data buffer to transfer the data signals to the group of NVM devices. In one embodiment, the NVM devices are to operate in a burst mode, to transfer data over 2N cycles, and the data buffer is to operate to transfer data over N cycles, wherein the storage controller is to issue consecutive commands to the data buffer to cause the data buffer to operate for 2N cycles in response to the consecutive commands. In one embodiment, the data buffer is to eliminate stall cycles internally to produce 2N cycles of continuous data transfer in response to the consecutive commands. In one embodiment, the data buffer comprises a host interface to the storage controller and a memory interface to the group of NVM devices, and wherein the data buffer is to apply different configuration settings for the host interface than the memory interface, wherein the different configuration settings include at least a different timing configuration setting. In one embodiment, the data buffer is to re-drive data signals from the storage controller to the NVM devices, including to synchronize the data signals to a protocol timing of an interface of the NVM devices. In one embodiment, the data buffer is to re-drive data signals from the NVM devices to the storage controller, including to synchronize the data signals to a protocol timing of a storage controller interface. In one embodiment, the group of NVM devices comprises a first group and the data buffer comprises a first data buffer, and further comprising a second group of NVM devices and a second data buffer coupled between the second group of NVM devices and the storage controller. In one embodiment, further comprising a third data buffer, wherein the first and second groups couple to the storage controller in a cascaded manner, with the third data buffer coupled between the storage controller and the first and second data buffers. In one embodiment, further comprising a command buffer coupled between the group of NVM devices and the storage controller on a command bus, the command buffer to re-drive command signals on the command bus, and synchronize command signals to a clock signal. In one embodiment, further comprising one or more of: at least one processor communicatively coupled to the storage controller; a memory controller communicatively coupled to the storage controller; a display communicatively coupled to at least one processor; a battery to power the system; or a network interface communicatively coupled to at least one processor.

In one aspect, a solid state drive (SSD) includes: a storage controller including an interface to couple to a host processor, the storage controller to manage read and write requests from the host processor; and multiple storage circuits coupled to the storage controller, including a plurality of nonvolatile memory (NVM) devices; and a data buffer coupled between the plurality of NVM devices and the storage controller on a data bus, the data buffer to re-drive data signals on the data bus, and synchronize data signals to a clock signal.

In one embodiment, the storage controller is to first send a command signal to the group of NVM devices, and next send a control signal to the data buffer, wherein the control signal is to trigger the data buffer to transfer the data signals to the group of NVM devices. In one embodiment, the NVM devices are to operate in a burst mode, to transfer data over 2N cycles, and the data buffer is to operate to transfer data over N cycles, wherein the storage controller is to issue consecutive commands to the data buffer to cause the data buffer to operate for 2N cycles in response to the consecutive commands. In one embodiment, the data buffer is to eliminate stall cycles internally to produce 2N cycles of continuous data transfer in response to the consecutive commands. In one embodiment, the data buffer comprises a host interface to the storage controller and a memory interface to the group of NVM devices, and wherein the data buffer is to apply different configuration settings for the host interface than the memory interface, wherein the different configuration settings include at least a different timing configuration setting. In one embodiment, the data buffer is to re-drive data signals from the storage controller to the NVM devices, including to synchronize the data signals to a protocol timing of an interface of the NVM devices. In one embodiment, the data buffer is to re-drive data signals from the NVM devices to the storage controller, including to synchronize the data signals to a protocol timing of a storage controller interface. In one embodiment, the multiple storage circuits are organized in a cascade, wherein first and second data buffers couple, respectively, to first and second pluralities of NVM devices, and a third data buffer couples between the first and second data buffers and the storage controller. In one embodiment, the multiple storage circuits further comprising: a command buffer coupled between the group of NVM devices and the storage controller on a command bus, the command buffer to re-drive command signals on the command bus, and synchronize command signals to a clock signal.

In one aspect, a method for data access includes: receiving a buffer command at a buffer coupled between a group of nonvolatile memory (NVM) devices and a storage controller, the buffer command to be issued after a data access command issued to the group of NVM devices; and responsive to receiving the buffer command, re-driving data signals on a data bus between the NVM devices and the storage controller, including synchronizing the data signals to a clock signal.

In one embodiment, receiving the buffer command comprises receiving two consecutive commands, and responsive to receiving the two consecutive commands, re-driving two consecutive bursts of data signals as one double-length burst of data signals. In one embodiment, further comprising: re-timing the data signals to internally eliminate stall cycles to produce the double-length burst of continuous data transfer in response to the consecutive commands. In one embodiment, further comprising: training a host interface coupled to the storage controller, to configure settings for the host interface; and training a memory interface coupled to the NVM devices, to configure settings for the memory interface, wherein training the memory interface comprises writing fixed data patterns to a register on buffer via the host interface. In one embodiment, re-driving data signals on the data bus comprises re-driving write data signals from the storage controller to the NVM devices. In one embodiment, re-driving the write data signals comprises synchronizing the write data signals to a protocol timing of an interface of the NVM devices. In one embodiment, re-driving data signals on the data bus comprises re-driving read data signals from the NVM devices to the storage controller. In one embodiment, re-driving the read data signals comprises synchronizing the read data signals to a protocol timing of a storage controller interface. In one embodiment, re-driving data signals on the data bus comprises re-driving write data signals from the storage controller to the NVM devices. In one embodiment, the buffer comprises a data buffer, and further comprising: receiving a buffer command at a command buffer coupled between the group of nonvolatile memory (NVM) devices and the storage controller; and responsive to receiving the buffer command, re-driving a data access command on a command bus between the NVM devices and the storage controller, including synchronizing the data access command to a clock signal. In one aspect, an apparatus comprising means for performing operations to execute a method for data access in accordance with any embodiment of the above method. In one aspect, an article of manufacture comprising a computer readable storage medium having content stored thereon, which when accessed causes a machine to perform operations to execute a method for data access in accordance with any embodiment of the above method.

In one aspect, a buffer device includes: memory interface logic to couple to a group of nonvolatile memory (NVM) devices; host interface logic to couple to a storage controller, the storage controller to manage reading and writing to the NVM devices; and control logic to re-drive data signals between the NVM devices and the storage controller on a data bus, and synchronize the data signals to a clock signal.

In one embodiment, the storage controller is to first send a command signal to the group of NVM devices, and next send a control signal to the data buffer, wherein the control signal is to trigger the data buffer to transfer the data signals to the group of NVM devices. In one embodiment, the NVM devices are to operate in a burst mode, to transfer data over 2N cycles, and the data buffer is to operate to transfer data over N cycles, wherein the storage controller is to issue consecutive commands to the data buffer to cause the data buffer to operate for 2N cycles in response to the consecutive commands. In one embodiment, the data buffer is to eliminate stall cycles internally to produce 2N cycles of continuous data transfer in response to the consecutive commands. In one embodiment, the data buffer comprises a host interface to the storage controller and a memory interface to the group of NVM devices, and wherein the data buffer is to apply different configuration settings for the host interface than the memory interface, wherein the different configuration settings include at least a different timing configuration setting. In one embodiment, the data buffer is to re-drive data signals from the storage controller to the NVM devices, including to synchronize the data signals to a protocol timing of an interface of the NVM devices. In one embodiment, the data buffer is to re-drive data signals from the NVM devices to the storage controller, including to synchronize the data signals to a protocol timing of a storage controller interface. In one embodiment, the group of NVM devices comprises a first group and the data buffer comprises a first data buffer, and further comprising a second group of NVM devices and a second data buffer coupled between the second group of NVM devices and the storage controller. In one embodiment, further comprising a third data buffer, wherein the first and second groups couple to the storage controller in a cascaded manner, with the third data buffer coupled between the storage controller and the first and second data buffers. In one embodiment, further comprising a command buffer coupled between the group of NVM devices and the storage controller on a command bus, the command buffer to re-drive command signals on the command bus, and synchronize command signals to a clock signal.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A system, comprising:
    at least one nonvolatile memory (NVM) device;
    a storage controller to manage reading and writing to the at least one NVM device; and
    a data buffer coupled, using a host interface, to the storage controller on a double data rate data bus and coupled, using a memory interface, to the at least one NVM device, wherein the data buffer is to buffer data between the storage controller and the at least one NVM device, and wherein the storage controller is to:
    train the host interface to configure input/output setting parameters for the host interface; and
    train the memory interface to configure input/output setting parameters for the memory interface, wherein to train the memory interface, the storage controller:
        generates training data for the memory interface;
        configures input/output setting parameters for the memory interface;
        sends training data and evaluates a performance of the memory interface; and
        in response to determining that there are no more input/output setting parameters to test, maintains configuration settings for a best performance of the memory interface.

2. The system of claim 1, wherein to train the memory interface, the storage controller writes fixed data patterns to a register on buffer using the host interface.

3. The system of claim 1, wherein the generated training data for the memory interface is the same as generated training data for the host interface.

4. The system of claim 1, wherein the storage controller is further to:
    detect an event; and
    in response to detecting the event, initiate a training sequence comprising training the host interface and the memory interface.

5. The system of claim 1, wherein the input/output setting parameters are one or more of voltage levels, current levels, temperature, delay for driving a signal and delay for receiving a signal.

6. The system of claim 1, wherein the performance of the interface is determined based on a maximum threshold of errors per time period.

7. A system, comprising:
    at least one nonvolatile memory (NVM) device;
    a storage controller to manage reading and writing to the at least one NVM device; and a data buffer coupled, using a host interface, to the storage controller on a double data rate data bus and coupled, using a memory interface, to the at least one NVM device, wherein the data buffer is to buffer data between the storage controller and the at least one NVM device, and wherein the storage controller is to:

train the memory interface to configure input/output setting parameters for the memory interface; and train the host interface to configure input/output setting parameters for the host interface, wherein to train the host interface, the storage controller:

generates training data for the host interface;

configures input/output setting parameters for the host interface;

sends training data and evaluates a performance of the host interface; and in response to determining that there are no more input/output setting parameters to test, maintains configuration settings for a best performance of the host interface.

8. A method for training a host interface and a memory interface of a buffer, the method comprising:

training, using a storage controller coupled to the buffer, the host interface coupled to a storage controller, to configure input/output setting parameters for the host interface; and training, using the storage controller, a memory interface coupled to a plurality of NVM devices, to configure input/output setting parameters for the memory interface, wherein training the memory interface comprises:

generating, using the storage controller, training data for the memory interface;

configuring, using the storage controller, input/output setting parameters for the memory interface;

sending, using the storage controller, training data, and evaluating a performance of the memory interface; and in response to the storage controller determining that there are no more input/output setting parameters to test, maintaining configuration settings for a best performance of the memory interface.

9. The method for training a host interface and a memory interface of a buffer of claim 8, wherein training the memory interface further comprises writing, by the storage controller, fixed data patterns to a register on the buffer using the host interface.

10. The method for training a host interface and a memory interface of a buffer of claim 8, further comprising:

detecting, using the storage controller, an event; and in response to the storage controller detecting the event, causing to initiate a training sequence comprising training the host interface and the memory interface.

11. The method for training a host interface and a memory interface of a buffer of claim 8, wherein the input/output setting parameters are one or more of voltage levels, current levels, temperature, delay for driving a signal and delay for receiving a signal.

12. The method for training a host interface and a memory interface of a buffer of claim 8, wherein evaluating the performance of the memory interface is based on determining a maximum threshold of errors per time period on the memory interface.

13. A method for training a host interface and a memory interface of a buffer, the method comprising:

training, using the storage controller, a memory interface coupled to a plurality of NVM devices, to configure input/output setting parameters for the memory interface; and training, using a storage controller coupled to the buffer, the host interface coupled to a storage controller, to configure input/output setting parameters for the host interface, wherein training the host interface comprises:

generating, using the storage controller, training data for the host interface;

configuring, using the storage controller, input/output setting parameters for the host interface;

sending, using the storing controller, training data and evaluating a performance of the host interface; and in response to the storage controller determining that there are no more input/output setting parameters to test, maintaining configuration settings for a best performance of the host interface.

14. A dual inline memory module (DIMM), comprising:

a storage controller to manage read and write requests to nonvolatile memory of the DIMM; and at least one storage circuit coupled to the storage controller, including:

at least one nonvolatile memory (NVM) device; and a data butter coupled, using a host-side data bus interface, to the storage controller on a double data rate data bus, and coupled, using a memory-side data bus interface, to the NVM device, the data buffer to buffer data between the storage controller and the at least one NVM device, wherein the data buffer is to train the host-side data bus interface for a DDR protocol between the storage controller and the data buffer, and separately to train the memory-side data bus interface specific to a nonvolatile media of the at least one NVM device, wherein to train the memory-side data bus interface, the data buffer:

generates training data for the memory-side data bus interface;

configures input/output setting parameters for the memory-side data bus interface;

sends training data and evaluates a performance of the memory-side data bus interface; and in response to determining that there are no more input/output setting parameters to test, maintains configuration settings for a best performance of the memory-side data bus interface.

15. A dual inline memory module (DIMM), comprising:

a storage controller to manage read and write requests to nonvolatile memory of the DIMM; and at least one storage circuit coupled to the storage controller, including:

at least one nonvolatile memory (NVM) device; and a data butter coupled, using a host-side data bus interface, to the storage controller on a double data rate data bus, and coupled, using a memory-side data bus interface, to the NVM device, the data buffer to buffer data between the storage controller and the at least one NVM device, wherein the data buffer is to train the host-side data bus interface for a DDR protocol between the storage controller and the data buffer, and separately to train the memory-side data bus interface specific to a nonvolatile media of the at least one NVM device, wherein to train the host-side data bus interface, the data buffer:

generates training data for the host-side data bus interface;

configures input/output setting parameters for the host-side data bus interface;

sends training data and evaluates a performance of the host-side data bus interface; and in response to determining that there are no more input/output setting parameters to test, maintains configuration settings for a best performance of the host-side data bus interface.

\* \* \* \* \*